United States Patent
Kudoh

(10) Patent No.: US 10,205,893 B2
(45) Date of Patent: Feb. 12, 2019

(54) SOLID-STATE IMAGING DEVICE AND DRIVING METHOD OF SOLID-STATE IMAGING DEVICE

(71) Applicant: SONY CORPORATION, Tokyo (JP)

(72) Inventor: Yoshiharu Kudoh, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/557,845

(22) PCT Filed: Jan. 7, 2016

(86) PCT No.: PCT/JP2016/050338
§ 371 (c)(1),
(2) Date: Sep. 13, 2017

(87) PCT Pub. No.: WO2016/152184
PCT Pub. Date: Sep. 29, 2016

(65) Prior Publication Data
US 2018/0295299 A1   Oct. 11, 2018

(30) Foreign Application Priority Data

Mar. 25, 2015   (JP) .................................. 2015-062303

(51) Int. Cl.
*H04N 5/353* (2011.01)
*H01L 27/146* (2006.01)
*H04N 5/3745* (2011.01)

(52) U.S. Cl.
CPC ....... *H04N 5/353* (2013.01); *H01L 27/14603* (2013.01); *H01L 27/14641* (2013.01); *H01L 27/14656* (2013.01); *H04N 5/3745* (2013.01)

(58) Field of Classification Search
CPC .................. H04N 5/353; H04N 5/3745; H01L 27/14603; H01L 27/14641; H01L 27/14656
See application file for complete search history.

(56) References Cited

U.S. PATENT DOCUMENTS

| 8,934,036 B2 | 1/2015 | Oike |
| 2006/0065915 A1* | 3/2006 | Kuwazawa ....... H01L 27/14603 257/292 |

(Continued)

FOREIGN PATENT DOCUMENTS

| CN | 101562707 A | 10/2009 |
| CN | 102208423 A | 10/2011 |

(Continued)

OTHER PUBLICATIONS

International Search Report and Written Opinion of PCT Application No. PCT/JP2016/050338, dated Mar. 15, 2016, 09 pages of ISRWO.

*Primary Examiner* — Amy R Hsu
(74) *Attorney, Agent, or Firm* — Chip Law Group

(57) ABSTRACT

An imaging device of a CMOS type having a global shutter function is downsized.
In the imaging device, a photoelectric conversion unit generates charge corresponding to an exposure amount in a predetermined exposure period. A generated charge retaining unit is formed to have a predetermined impurity concentration in a semiconductor substrate and retains the charge. A generated charge transferring unit renders the photoelectric conversion unit and the generated charge retaining unit conductive therebetween after the exposure period has elapsed and transfers the charge from the photoelectric conversion unit to the generated charge retaining unit. An output charge retaining unit is formed to have substantially the same impurity concentration as that of the generated charge retaining unit and retains charge. A retained charge distributing unit renders the generated charge retaining unit and the output charge retaining unit conductive therebetween and uniformly distributes the charge retained in the generated charge retaining unit to the generated charge retaining unit and the output charge retain- (Continued)

ing unit. A signal generating unit generates a signal corresponding to the charge retained in the output charge retaining unit as an image signal after the distribution in the retained charge distributing unit.

11 Claims, 19 Drawing Sheets

(56) References Cited

U.S. PATENT DOCUMENTS

| | | | | |
|---|---|---|---|---|
| 2006/0086996 | A1* | 4/2006 | Kuwazawa | H01L 27/14609 257/428 |
| 2009/0251582 | A1* | 10/2009 | Oike | H01L 27/14609 348/308 |
| 2011/0241089 | A1* | 10/2011 | Ohri | H01L 27/14607 257/291 |
| 2012/0242876 | A1* | 9/2012 | Hagiwara | H01L 27/14618 348/294 |
| 2012/0327278 | A1 | 12/2012 | Oike | |
| 2013/0215305 | A1* | 8/2013 | Yamashita | H04N 5/37457 348/301 |
| 2014/0327802 | A1* | 11/2014 | Mabuchi | H04N 5/3559 348/308 |
| 2016/0254305 | A1* | 9/2016 | Sakano | H01L 27/14609 257/231 |

FOREIGN PATENT DOCUMENTS

| | | |
|---|---|---|
| CN | 102209206 A | 10/2011 |
| CN | 102595050 A | 7/2012 |
| CN | 104137536 A | 11/2014 |
| EP | 2107610 A1 | 10/2009 |
| EP | 2654081 A2 | 10/2013 |
| EP | 2809065 A1 | 12/2014 |
| JP | 2004-111590 A | 4/2004 |
| JP | 2009-268083 A | 11/2009 |
| JP | 2011-216673 A | 10/2011 |
| JP | 2012-009697 A | 1/2012 |
| JP | 2012-9697 A | 1/2012 |
| JP | 2012-147187 A | 8/2012 |
| JP | 2013-172208 A | 9/2013 |
| KR | 10-2009-0105871 A | 10/2009 |
| KR | 10-2014-0119028 A | 10/2014 |
| TW | 201338526 A | 9/2013 |
| WO | 2011/161909 A1 | 12/2011 |
| WO | 2013/111629 A1 | 8/2013 |

* cited by examiner

US 10,205,893 B2

SOLID-STATE IMAGING DEVICE AND DRIVING METHOD OF SOLID-STATE IMAGING DEVICE

CROSS REFERENCE TO RELATED APPLICATIONS

This application is a U.S. National Phase of International Patent Application No. PCT/JP2016/050338 filed on Jan. 7, 2016, which claims priority benefit of Japanese Patent Application No. JP 2015-062303 filed in the Japan Patent Office on Mar. 25, 2015. Each of the above-referenced applications is hereby incorporated herein by reference in its entirety.

TECHNICAL FIELD

The present technology relates to a solid-state imaging device and a driving method of the solid-state imaging device. More particularly, the present technology relates to a CMOS-type solid-state imaging device and a driving method thereof.

BACKGROUND ART

Conventionally, imaging devices of a complementary metal oxide semiconductor (CMOS) type are used as imaging devices used for cameras and the like. This imaging device has a pixel array unit in which pixels including a photoelectric conversion unit are arranged in a two-dimensional shape. Here, the photoelectric conversion unit is a semiconductor element which performs photoelectric conversion for generating charge corresponding to the amount of incident light. A period during which this photoelectric conversion is performed corresponds to an exposure period in the imaging device. The exposure period and a signal reading period for reading charge generated in the exposure period as a signal are alternately performed and image signals of consecutive frames can be thereby obtained. In this imaging device, in order to generate an image signal of one frame, it is necessary to read image signals of all the rows. Reading of these signals is performed sequentially row by row. In a conventional CMOS type imaging device, exposure is started immediately after signal reading. Therefore, timings of start and end of exposure are shifted by every row and thus there is a problem that distortion occurs in an output image.

Therefore, there has been proposed an imaging device having a global shutter function for starting and ending exposure simultaneously for all lines (see, for example, Patent Document 1).

CITATION LIST

Patent Document

Patent Document 1: Publication of Unexamined Patent Application No. 2004-111590

SUMMARY OF THE INVENTION

Problems to be Solved by the Invention

In the above-described conventional technique, a charge accumulation unit for retaining charge generated by the photoelectric conversion unit is included in each pixel. After an exposure period has elapsed, generated charge is transferred to the charge accumulation unit simultaneously in all the pixels. Then, upon signal reading, an image signal based on the charge transferred to the charge accumulation unit is generated and read out row by row. Therefore, timings of start and end of exposure can be equalized over the entire row, and a global shutter function can be implemented.

A pixel in this imaging device is arranged with a region for retaining charge which is formed in the same semiconductor substrate as the photoelectric conversion unit and the charge accumulation unit described above. This region is called a floating diffusion and is an area to which an input line for signal reading is connected. In order to generate an image signal, it is necessary to transfer charge generated by the photoelectric conversion unit to the floating diffusion. That is, it is necessary to perform transfer from the photoelectric conversion unit to the charge accumulation unit and transfer from the charge accumulation unit to the floating diffusion at the time of reading a signal. In order to prevent residual charge and to transfer all the charge, it is necessary for the photoelectric conversion unit, the charge accumulation unit, and the floating diffusion to have stepwise potential. That is, the charge accumulation unit needs to be formed at a potential intermediate between that of the photoelectric conversion unit and that of the floating diffusion. As described above, the accumulation region is limited in the height of potential, and a large occupied area is required to obtain a desired capacity. As a result, there is a disadvantage that the size of an imaging device increases.

The present technology has been devised in consideration to such circumstances with an object of downsizing an imaging device having a global shutter function.

Solutions to Problems

The present technology has been devised in order to solve the disadvantages described above. A first aspect of the present technology is a solid-state imaging device, including: a photoelectric conversion unit for generating charge corresponding to an exposure amount in a predetermined exposure period; a generated charge retaining unit for retaining the charge, the generated charge retaining unit being formed in a semiconductor substrate to have a predetermined impurity concentration; a generated charge transferring unit for rendering the photoelectric conversion unit and the generated charge retaining unit conductive therebetween after the exposure period has elapsed and transferring the charge from the photoelectric conversion unit to the generated charge retaining unit; an output charge retaining unit for retaining the charge, the output charge retaining unit being formed to have substantially the same impurity concentration as that of the generated charge retaining unit; a retained charge distributing unit for rendering the generated charge retaining unit and the output charge retaining unit conductive therebetween to uniformly distribute the charge retained in the generated charge retaining unit to the generated charge retaining unit and the output charge retaining unit; and a signal generating unit for generating a signal corresponding to the charge retained in the output charge retaining unit as an image signal after the distribution in the retained charge distributing unit. This results in an effect that the charge is uniformly distributed to the generated charge retaining unit and the output charge retaining unit of substantially the same potential.

Furthermore, in the first aspect, a charge discharging unit for discharging the charge retained in the output charge retaining unit after generation of the image signal in the signal generating unit may be further included. The signal generating unit may further generate the signal as a reference signal after the discharge in the charge discharging unit, and the retained charge distributing unit may further perform the distribution at the time of the discharge in the charge discharging unit and at the time of generating the reference signal in the signal generating unit. This results in an effect that the reference signal is generated after generation of the image signal and the discharge of the charge.

Furthermore, in the first aspect, the retained charge distributing unit may temporarily render the generated charge retaining unit and the output charge retaining unit nonconductive therebetween during a period between the discharge in the charge discharging unit and the generation of the reference signal in the signal generating unit and then render conductive therebetween. This results in an effect that the output charge retaining unit becomes temporarily nonconductive during a period between the discharge of the charge and generation of the reference signal.

Furthermore, in the first aspect, a signal processing unit for subtracting the reference signal from the image signal may further be included. This results in an effect that the reference signal is subtracted from the image signal.

Furthermore, in the first aspect, a generated charge retaining gate unit for controlling potential of the generated charge retaining unit may further be included. The generated charge transferring unit may include a generated charge transferring gate unit for controlling the conduction, and the generated charge transferring gate unit may be connected to the generated charge retaining gate unit. This results in an effect that the generated charge retaining unit is controlled of its potential by the generated charge retaining gate unit connected to a gate of the generated charge transferring unit.

Furthermore, in the first aspect, an auxiliary charge retaining unit for retaining the charge, the auxiliary charge retaining unit being formed to have an impurity concentration lower than that of the generated charge retaining unit and an auxiliary charge transferring unit for rendering the photoelectric conversion unit and the auxiliary charge retaining unit conductive therebetween after the exposure period has elapsed and transferring the charge from the photoelectric conversion unit to the auxiliary charge retaining unit may be further included. The generated charge transferring unit may perform transfer of the charge retained in the auxiliary charge retaining unit to the generated charge retaining unit executed by rendering the auxiliary charge retaining unit and the generated charge retaining unit conductive therebetween as first transfer synchronized with the transfer in the auxiliary charge transferring unit and second transfer subsequent to the first transfer. The retained charge distributing unit may perform the distribution as first distribution and second distribution after the first transfer and the second transfer, respectively, in the generated charge transferring unit, and the signal generating unit may generate the signal as a first image signal and a second image signal after the first distribution and the second distribution, respectively, in the retained charge distributing unit. This results in an effect that the charge generated by the photoelectric conversion unit is retained in the auxiliary charge retaining unit and the generated charge retaining unit.

Furthermore, in the first aspect, a charge discharging unit for discharging the charge retained in the output charge retaining unit during a period between generation of the first image signal in the signal generating unit and the second transfer in the generated charge transferring unit may be further included. The signal generating unit may further generate the signal as a reference signal during a period between the discharge in the charge discharging unit and the second transfer in the generated charge transferring unit, and the retained charge distributing unit may further perform the distribution at the time of the discharge in the charge discharging unit and at the time of generating the reference signal in the signal generating unit. This results in an effect that the reference signal is generated after generation of the first image signal and the discharge of the charge.

Furthermore, in the first aspect, the retained charge distributing unit may temporarily render the generated charge retaining unit and the output charge retaining unit nonconductive therebetween during a period between the discharge in the charge discharging unit and the generation of the reference signal in the signal generating unit and then render conductive therebetween. This results in an effect that the output charge retaining unit becomes temporarily nonconductive during a period between the discharge of the charge and generation of the reference signal.

Furthermore, in the first aspect, a signal processing unit for subtracting a value obtained by doubling the reference signal from a value obtained by adding the first image signal and the second image signal may be further included. This results in an effect that a value obtained by doubling the reference signal is subtracted from a value obtained by adding the first image signal and the second image signal.

Furthermore, in the first aspect, an auxiliary charge retaining gate unit for controlling potential of the auxiliary charge retaining unit may be further included. The auxiliary charge transferring unit may include an auxiliary charge transferring gate unit for controlling the conduction, and the auxiliary charge transferring gate unit may be connected to the auxiliary charge retaining gate unit. This results in an effect that the auxiliary charge retaining unit includes the auxiliary charge retaining gate unit connected to the gate of the auxiliary charge transferring unit.

Furthermore, a second aspect of the present technology is a driving method of a solid-state imaging device, the method including: a generated charge transferring step of transferring and retaining charge to and in a generated charge retaining unit for retaining the charge corresponding to an exposure amount in a predetermined exposure period, the generated charge retaining unit being formed to have a predetermined impurity concentration; a retained charge distributing step of uniformly distributing the charge retained in the generated charge retaining unit to the output charge retaining unit, which is formed to have substantially the same impurity concentration as that of the generated charge retaining unit and retains the charge, and the generated charge retaining unit; and a signal generating step of generating a signal corresponding to the charge retained in the output charge retaining unit as an image signal. This results in an effect that the charge is uniformly distributed to the generated charge retaining unit and the output charge retaining unit of substantially the same potential.

Effects of the Invention

According to the present technology, an excellent effect of downsizing an imaging device having a global shutter function can be achieved. Note that effects described herein are not necessarily limited. Any one of the effects described in the present disclosure may be included.

MODE FOR CARRYING OUT THE INVENTION

Embodiments for carrying out the present technology (hereinafter referred to as "embodiments") will be described below. Descriptions will be given in the following order.

1. First embodiment (an example where charge generated by a photoelectric conversion unit is retained in a generated charge retaining unit)

2. Second embodiment (an example of sharing an output charge retaining unit)

3. Third embodiment (example where charge generated by a photoelectric conversion unit is retained by an auxiliary charge retaining unit and a generated charge retaining unit)

1. First Embodiment

[Configuration of Imaging Device]

Figure 1:
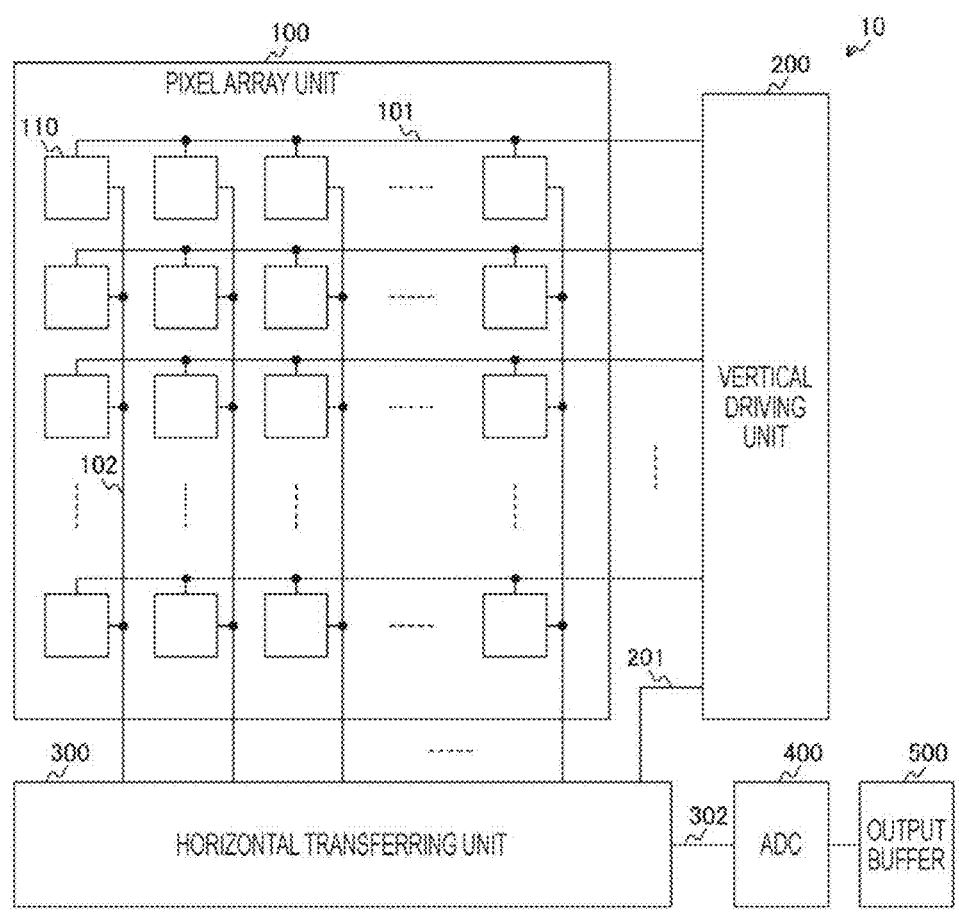
FIG. 1 is a diagram illustrating a configuration example of an imaging device 10 according to an embodiment of the present technology.

FIG. 1 is a diagram illustrating a configuration example of an imaging device 10 according to an embodiment of the present technology. The imaging device 10 includes a pixel array unit 100, a vertical driving unit 200, a horizontal transferring unit 300, an analog-digital converter (ADC) 400, and an output buffer 500. Note that the imaging device 10 is an example of the solid-state imaging device described in the claims.

In the pixel array unit 100, pixels 110 for generating image signals are arranged in a two-dimensional array shape. In the pixel array unit 100, a signal line 101 for transmitting a control signal to each of the pixels 110 and a signal line 102 for transmitting an image signal output from the pixel 110 are wired in an XY matrix shape. That is, one signal line 101 is commonly wired to the pixels 110 arranged in the same row, and the outputs of the pixels 110 arranged in the same column are commonly wired to one signal line 102.

The vertical driving unit 200 generates a control signal and outputs it to the pixel array unit 100 and the horizontal transferring unit 300. The vertical driving unit 200 outputs a control signal to the signal lines 101 corresponding to all rows of the pixel array unit 100. Output of a control signal by the vertical driving unit 200 includes signal output for controlling start and stop of exposure with respect to the pixels 110 of the pixel array unit 100 and signal output for controlling readout from the pixels 110 of the image signals obtained by the exposure. Signals for controlling start and stop of exposure are simultaneously output to all the pixels 110. As a result of this, a global shutter function can be implemented in the imaging device 10. On the other hand, signals for controlling readout of an image signal are output to the pixels 110 in one row sequentially row by row in the pixel array unit 100. That is, readout of an image signal is performed sequentially row by row. Details of control in the vertical driving unit 200 will be described later.

The horizontal transferring unit 300 performs processing on the image signal output from the pixel array unit 100. Output signals corresponding to the pixels 110 of one row of the pixel array unit 100 are simultaneously input to the horizontal transferring unit 300. The horizontal transferring unit 300 performs signal processing on the input image signals, performs parallel-serial conversion, and then outputs the converted signals to a signal line 302. Details of the processing in the horizontal transferring unit 300 will be described later.

The analog-digital converter 400 converts the image signals output from the horizontal transferring unit 300 from analog signals to digital signals (AD conversion).

The output buffer 500 outputs the image signals AD-converted by the analog-digital converter 400 to the outside of the imaging device 10.

[Circuit Configuration of Pixel]

Figure 2:
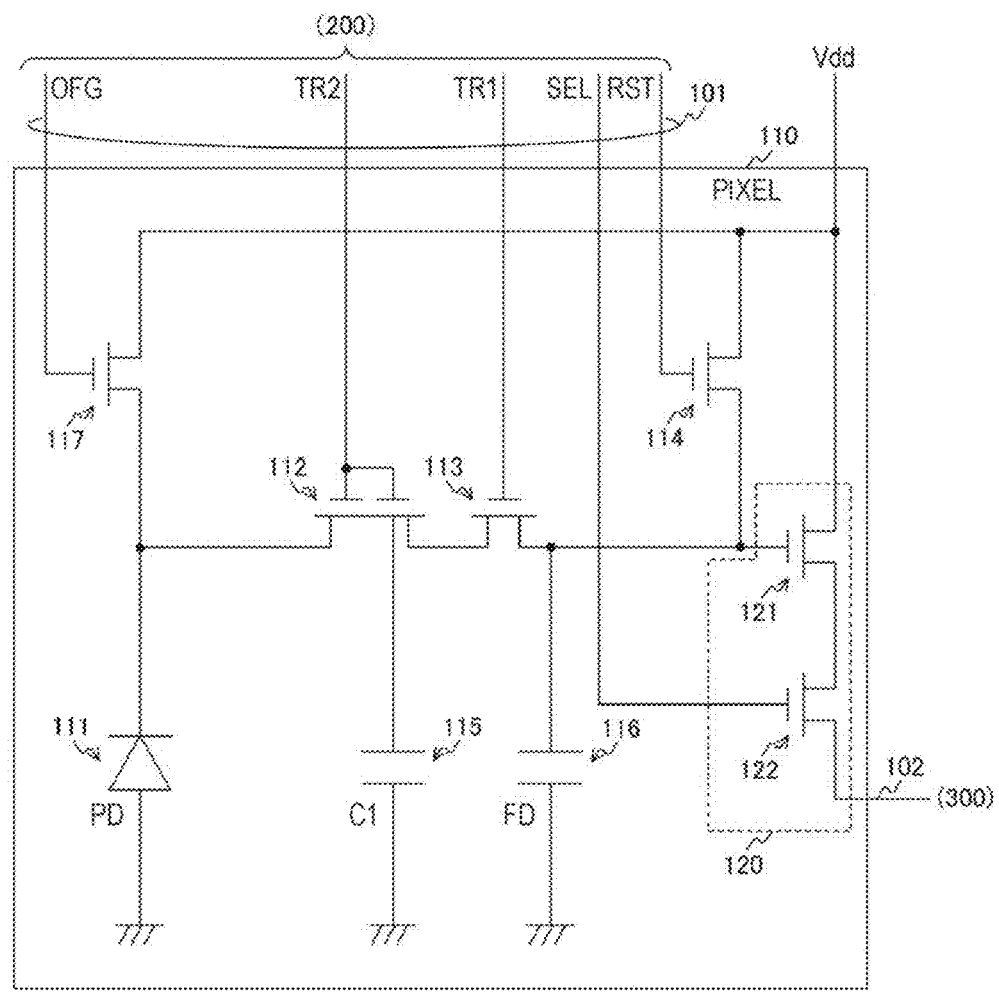
FIG. 2 is a diagram illustrating a configuration example of a pixel 110 according to a first embodiment of the present technology.

FIG. 2 is a diagram illustrating a configuration example of the pixel 110 according to the first embodiment of the present technology. The pixel 110 includes a photoelectric conversion unit 111, a generated charge transferring unit 112, a retained charge distributing unit 113, a charge discharging unit 114, a generated charge retaining unit 115, an output charge retaining unit 116, an overflow gate 117, and a signal generating unit 120. The signal generating unit 120 further includes metal oxide semiconductor (MOS) transistors 121 and 122. Note that each of the generated charge transferring unit 112, the retained charge distributing unit 113, the charge discharging unit 114, and the overflow gate 117 is formed by a MOS transistor.

In addition to the signal line 101 and the signal line 102, a power supply line Vdd and grounding lines are connected to the pixel 110. A power source of the pixel 110 is supplied through these signal lines. Furthermore, the signal line 101 is formed by a plurality of signal lines (OFG, TR1, TR2, SEL, and RST). An over flow gate (OFG) is a signal line transmitting a control signal to the overflow gate 117. Transfer 1 (TR1) is a signal line transmitting a control signal to the retained charge distributing unit 113. Transfer 2 (TR2) is a signal line transmitting a control signal to the generated charge transferring unit 112. Select (SEL) is a signal line transmitting a control signal to the MOS transistor 122. Reset (RST) is a signal line transmitting a control signal to the charge discharging unit 114. As illustrated in the figure, these are all connected to a gate of the MOS transistors. When a voltage higher than or equal to a threshold voltage between a gate and a source (hereinafter referred to as an ON signal) is input through these signal lines, a corresponding MOS transistor is rendered conductive.

As illustrated in the figure, an anode of the photoelectric conversion unit 111 is grounded, and a cathode is connected to a source of the generated charge transferring unit 112 and a source of the overflow gate 117. A gate and a drain of the overflow gate 117 are connected to OFG and Vdd, respectively. A drain of the generated charge transferring unit 112 is connected to a source of the retained charge distributing unit 113 and one end of the generated charge retaining unit 115. The other end of the generated charge retaining unit 115 is grounded. A gate of the generated charge transferring unit 112 is connected to the signal line TR2, and a gate of the retained charge distributing unit 113 is connected to the signal line TR1. Note that a gate, which will be described later, is arranged in the generated charge retaining unit 115, and this gate is connected to the gate of the generated charge transferring unit.

A drain of the retained charge distributing unit 113 is connected to a source of the charge discharging unit 114, a gate of the MOS transistor 121, and one end of the output charge retaining unit 116. The other end of the output charge retaining unit 116 is grounded. A gate and a drain of the charge discharging unit 114 are connected to RST and Vdd, respectively. A drain and a source of the MOS transistor 121 are connected to Vdd and a drain of the MOS transistor 122, respectively. A gate and a source of the MOS transistor 122 are connected to SEL and the signal line 102, respectively.

The photoelectric conversion unit 111 generates charge according to an amount of irradiated light and accumulates the generated charge. The photoelectric conversion unit 111 is formed by a photodiode.

The generated charge transferring unit 112 is controlled by TR2 to transfer the charge generated by the photoelectric conversion unit 111 to the generated charge retaining unit 115. The generated charge transferring unit 112 renders the photoelectric conversion unit 111 and the generated charge retaining unit 115 conductive therebetween and thereby performs transfer of the charge.

The generated charge retaining unit 115 retains the charge transferred by the generated charge transferring unit 112. The generated charge retaining unit 115 is formed in a source region of the generated charge transferring unit 112, and has a gate for controlling potential of this source region.

Note that, in this embodiment of the present technology, this gate is connected to the gate of the generated charge transferring unit 112. Detailed configurations of the generated charge transferring unit 112 and the generated charge retaining unit 115 will be described later.

The retained charge distributing unit 113 is controlled by TR1 to uniformly distribute the charge retained in the generated charge retaining unit 115 to the generated charge retaining unit 115 and the output charge retaining unit 116. The retained charge distributing unit 113 renders the generated charge retaining unit 115 and the output charge retaining unit 116 conductive therebetween, and thereby distributes the charge.

The output charge retaining unit 116 retains charge. The output charge retaining unit 116 retains the charge distributed by the retained charge distributing unit 113. As will be described later, the generated charge retaining unit 115 and the output charge retaining unit 116 are formed to have substantially the same impurity concentration on the semiconductor substrate.

The charge discharging unit 114 is controlled by RST to discharge the charge retained in the output charge retaining unit 116. The charge discharging unit 114 renders the output charge retaining unit 116 and Vdd conductive therebetween and thereby discharges the charge.

The overflow gate 117 discharges charge excessively generated in the photoelectric conversion unit 111. The overflow gate 117 further renders the photoelectric conversion unit 111 and Vdd conductive therebetween and thereby further discharges charge accumulated in the photoelectric conversion unit 111. Here, the overflow gate 117 is controlled by OFG.

The signal generating unit 120 generates a signal corresponding to the charge retained in the output charge retaining unit 116. The signal generating unit 120 includes the MOS transistors 121 and 122. The MOS transistor 121 outputs to a source a voltage corresponding to the charge retained in the output charge retaining unit 116. Furthermore, the MOS transistor 122 is controlled by SEL, and the voltage of the source of the MOS transistor 121 is output to the signal line 102 when the MOS transistor 122 is in a conductive state.

[Operation in Pixel]

When an ON signal is input from OFG, the overflow gate 117 is rendered conductive and Vdd is applied to the cathode of the photoelectric conversion unit 111. As a result, the charge accumulated in the photoelectric conversion unit 111 is discharged. Thereafter, charge corresponding to an exposure amount is newly generated and accumulated in the photoelectric conversion unit 111.

After a predetermined exposure time has elapsed, an ON signal is input from TR2, whereby the generated charge transferring unit 112 is rendered conductive. As a result of this, the photoelectric conversion unit 111 and the generated charge retaining unit 115 are brought into a conductive state, and the charge accumulated in the photoelectric conversion unit 111 is transferred to the generated charge retaining unit 115. In order to increase a photoelectric conversion efficiency and to prevent occurrence of an afterimage, it is necessary that the whole charge accumulated in the photoelectric conversion unit 111 is transferred to the generated charge retaining unit 115, and the photoelectric conversion unit 111 is depleted. Therefore, it is necessary that the generated charge retaining unit 115 has sufficiently high potential as compared to that of the photoelectric conversion unit 111.

Note that the transfer by the generated charge transferring unit 112 is performed simultaneously in all the pixels 110 arranged in the pixel array unit 100. This is for implementing the global shutter function. On the other hand, operations described below are sequentially executed sequentially row by row in the pixels 110 arranged in the pixel array unit 100.

When an ON signal is input from TR1, the retained charge distributing unit 113 becomes conductive. As a result of this, the generated charge retaining unit 115 and the output charge retaining unit 116 are brought into a conductive state, and the charge retained in the generated charge retaining unit 115 is uniformly distributed to the generated charge retaining unit 115 and the output charge retaining unit 116. As described above, since the generated charge retaining unit 115 and the output charge retaining unit 116 are formed to have substantially the same impurity concentration in the semiconductor substrate, they have substantially the same potential. Therefore, the charge retained in the generated charge retaining unit 115 is retained in the generated charge retaining unit 115 and the output charge retaining unit 116. Unlike the photoelectric conversion unit 111 described above, the generated charge retaining unit 115 is not depleted.

In this state, the signal generating unit 120 generates a signal. Specifically, the MOS transistor 121 generates a signal corresponding to the charge retained in the generated charge retaining unit 115 and the output charge retaining unit 116. Next, when an ON signal is input from SEL, the MOS transistor 122 is rendered conductive, and the signal generated by the MOS transistor 121 is output to the signal line 102. This signal corresponds to an image signal corresponding to light incident on the imaging device 10.

Thereafter, when an ON signal is input from RST and the charge discharging unit 114 is rendered conductive while the retained charge distributing unit 113 is rendered conductive, Vdd is applied to the generated charge retaining unit 115 and the output charge retaining unit 116, and the charge retained therein is discharged. Thereafter, the charge discharging unit 114 returns to a non-conductive state.

In this state, the signal generating unit 120 further generates a signal. That is, the MOS transistor 121 generates a signal corresponding to the charge retained in the output charge retaining unit 116. When an ON signal is input again to SEL, the MOS transistor 122 is rendered conductive, and the signal generated by the MOS transistor 121 is output to the signal line 102. This signal is a signal generated while the charge is discharged, and corresponds to a reference signal serving as a reference of the image signal described above.

Generally, even after the discharge described above has been performed, a unique signal component remains in each of the pixels 110, and this signal component is superimposed on the image signal and output as noise. Therefore, by obtaining this reference signal and subtracting it from the image signal described above, noise can be mitigated. Note that such a method is called correlated double sampling (CDS), which is widely used in imaging devices.

As described above, when charge is transferred between the photoelectric conversion unit 111 and the generated charge retaining unit 115 by the generated charge transferring unit 112, complete transfer, in which the whole charge accumulated in the photoelectric conversion unit 111 is transferred to the generated charge retaining unit 115, is executed. On the other hand, since the generated charge retaining unit 115 and the output charge retaining unit 116 have substantially the same potential, such full transfer cannot be performed at the time of transfer between the generated charge retaining unit 115 and the output charge retaining unit 116 by the retained charge distributing unit 113. However, by rendering the retained charge distributing unit 113 conductive, it is possible to integrate the generated charge retaining unit 115 and the output charge retaining unit 116 into one charge retaining region. As a result of this, the charge retained in the generated charge retaining unit 115 is uniformly distributed to the generated charge retaining unit 115 and the output charge retaining unit 116. By generating a signal by the signal generating unit 120 in this state, an accurate image signal and a reference signal can be obtained in a case where full transfer cannot be performed between the generated charge retaining unit 115 and the output charge retaining unit 116.

Also in the semiconductor substrate, as will be described later, in order to set the potential of the generated charge retaining unit 115 to substantially the same height (depth) as that of the output charge retaining unit 116, the generated charge retaining unit 115 can have high capacity per area on a semiconductor substrate surface. This allows the area of the generated charge retaining unit 115 to be reduced. Furthermore, as described above, since the generated charge retaining unit 115 and the output charge retaining unit 116 are integrated into one charge retaining area, capacity of the output charge retaining unit 116 can be smaller as compared to that of the generated charge retaining unit 115. This allows the area of the output charge retaining unit 116 to be also reduced.

In an ordinary CDS system, after generating the reference signal, the charge retained in the generated charge retaining unit 115 is transferred to the output charge retaining unit 116 to generate an image signal. On the other hand, in the first embodiment of the present technology, after generation of an image signal, a reference signal is generated. A reason for this will be explained. As described above, in the first embodiment of the present technology, the image signal is generated while the retained charge distributing unit 113 is rendered conductive. In order to improve the accuracy of generation of the reference signal, it is necessary to generate the reference signal under the same conditions as those of generation of the image signal. For this reason, it is necessary to render the retained charge distributing unit 113 conductive also at the time of generating the reference signal. This cannot be performed before generation of the image signal and thus is performed after generation of the image signal and discharge of the charge by the charge discharging unit 114.

Furthermore, as described above, in the first embodiment of the present technology, the retained charge distributing unit 113 is brought into a conductive state before generation of the image signal. Noise caused by this is generated and superimposed on the image signal. Therefore, the retained charge distributing unit 113 can be temporarily brought into a non-conductive state before generation of the reference signal and then be brought into a conductive state. As a result of this, similar noise is superimposed on the reference signal. By performing the CDS, the above noise is canceled, and the noise of the image signal can be reduced. Note that details of the driving method in the imaging device 10 will be described later.

[Configuration of Horizontal Transferring Unit]

Figure 3:
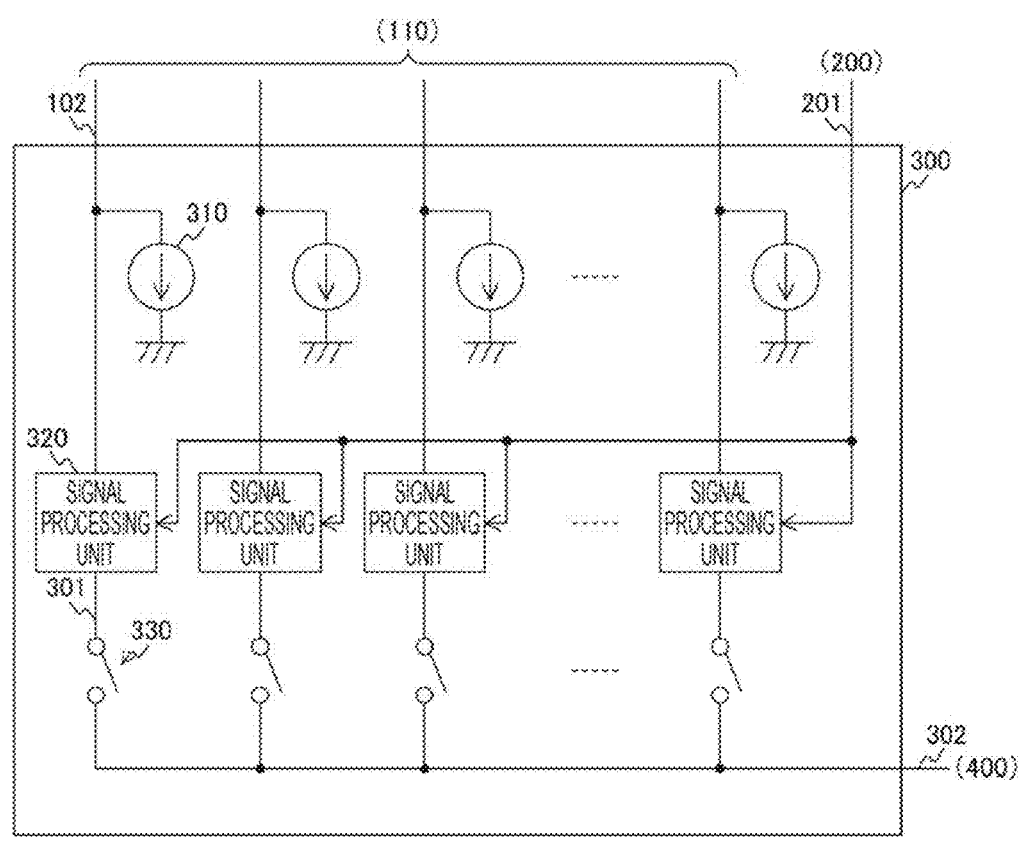
FIG. 3 is a diagram illustrating a configuration example of a horizontal transferring unit 300 according to the first embodiment of the present technology.

FIG. 3 is a diagram illustrating a configuration example of the horizontal transferring unit 300 according to the first embodiment of the present technology. The horizontal transferring unit 300 includes a constant current source 310, a signal processing unit 320, and a switch 330.

The signal line 102 is connected to one end of the constant current source 310 and an input of the signal processing unit 320. The other end of the constant current source 310 is grounded. An output of the signal processing unit 320 is connected to an input of the switch 330. Note that the signal processing unit 320 and the switch 330 are connected by a signal line 301.

Note that these are similarly arranged in all the signal lines 102 connected to the horizontal transferring unit 300. Outputs of all the switches 330 are connected to the signal line 302.

The constant current source 310 operates as a load of the MOS transistor 121 described of FIG. 2. That is, together with the MOS transistor 121, the constant current source 310 forms a source follower circuit.

The signal processing unit 320 performs processing of a signal output from the pixel 110. The signal processing unit 320 performs the CDS described above.

The switch 330 switches the output of the signal processing unit 320 to perform parallel-serial conversion. After processing in the signal processing unit 320 is completed, the switches 330 are turned on and off in order from the leftmost switch 330. As a result of this, output signals of the signal processing units 320 connected to the respective signal lines 301 are sequentially output to the signal line 302, and parallel-serial conversion is thereby performed.

[Configuration of Signal Processing Unit]

Figure 4:
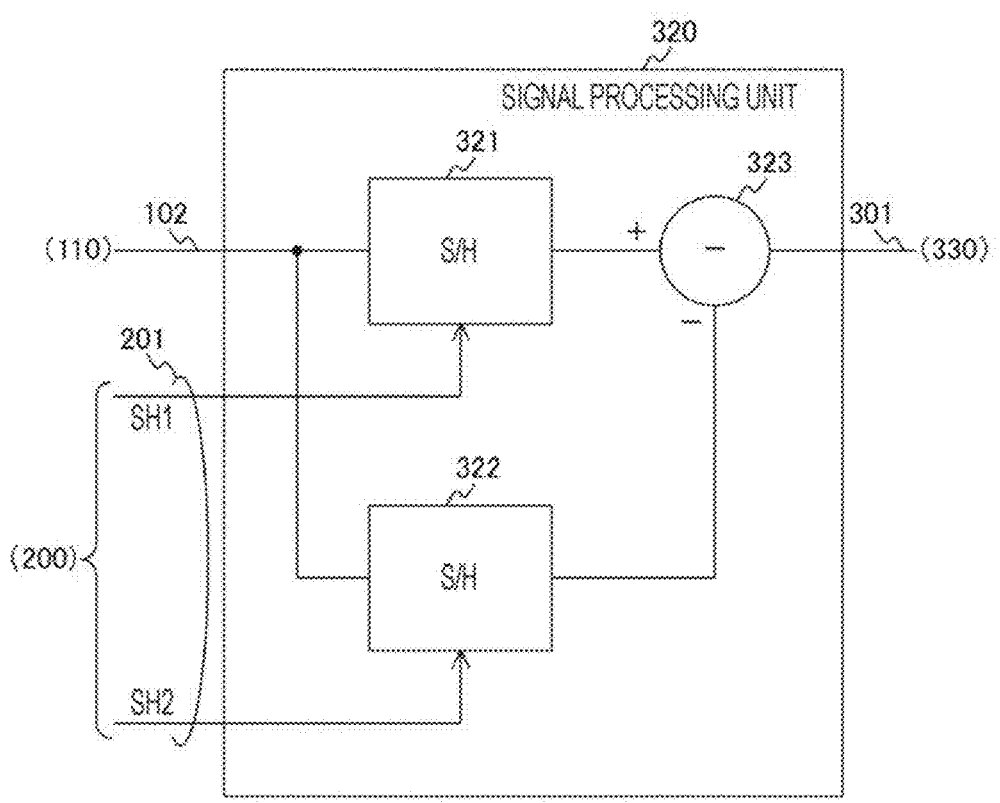
FIG. 4 is a diagram illustrating a configuration example of a signal processing unit 320 according to the first embodiment of the present technology.

FIG. 4 is a diagram illustrating a configuration example of the signal processing unit 320 according to the first embodiment of the present technology. The signal processing unit 320 includes sample-and-hold circuits (S/H) 321 and 322 and a subtractor 323. Furthermore, the signal line 201 is formed by a plurality of signal lines (SH1 and SH2).

The sample-and-hold circuits 321 and 322 are controlled by SH1 and SH2, respectively, and perform sampling and holding of a signal output to the signal line 102. The sample-and-hold circuit 321 will be described as an example. When an ON signal is input to SH1, the sample-and-hold circuit 321 performs sampling of a signal. Thereafter, when the input of the ON signal is stopped, the sampled signal is held and retained until an ON signal is input again to the SH1. The sample-and-hold circuits 321 and 322 in the figure perform sampling and holding on the image signal and the reference signal, respectively.

The subtractor 323 subtracts the reference signal held by the sample-and-hold circuit 322 from the image signal held in the sample-and-hold circuit 321. By this subtraction, the CDS is executed.

[Configuration of Pixel]

Figure 5:
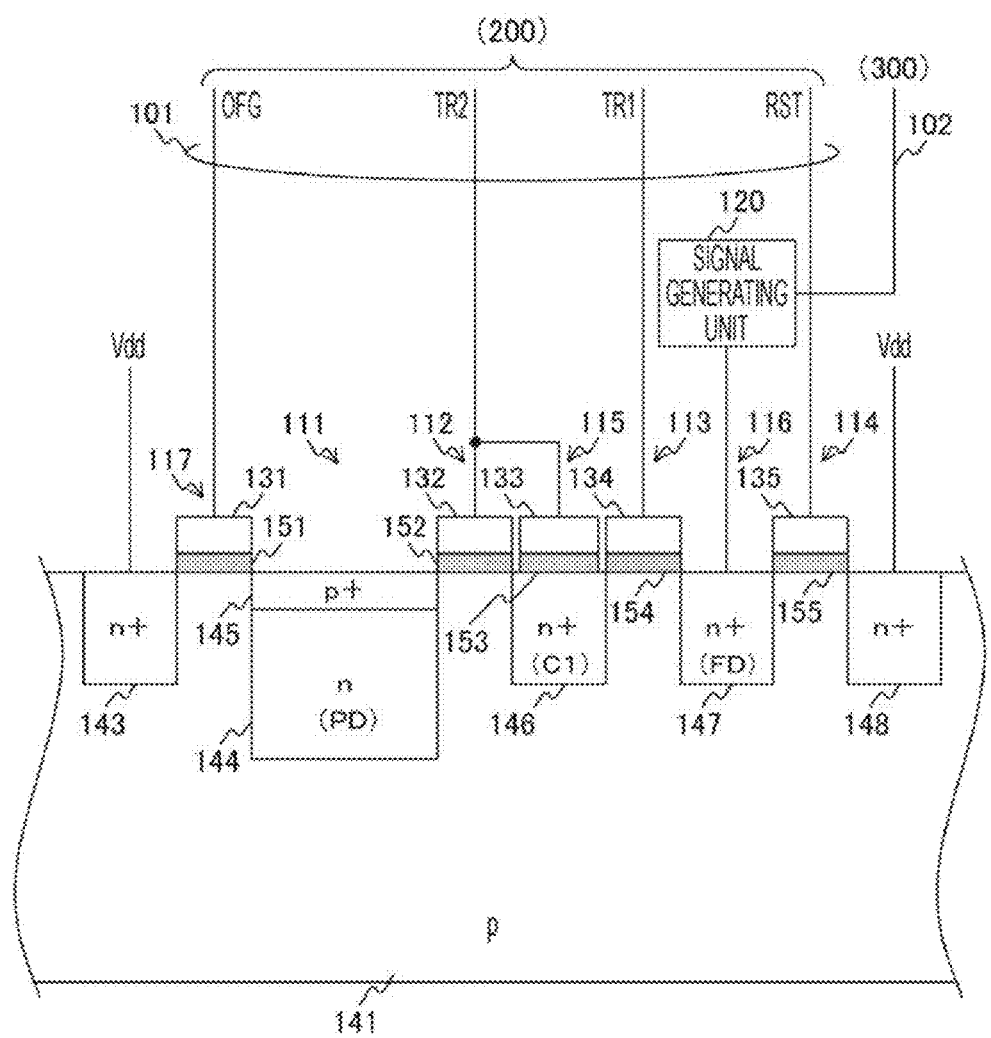
FIG. 5 is a schematic diagram illustrating a configuration example of a pixel 110 according to the first embodiment of the present technology.

FIG. 5 is a schematic diagram illustrating a configuration example of the pixel 110 according to the first embodiment of the present technology. The figure is a cross-sectional view schematically illustrating a configuration of the pixel 110 formed on a silicon semiconductor substrate. The figure is a cross-sectional view of a semiconductor substrate part including the photoelectric conversion unit 111, the generated charge transferring unit 112, the retained charge distributing unit 113, the charge discharging unit 114, the generated charge retaining unit 115, the output charge retaining unit 116, and the overflow gate 117. In addition, a signal generating unit 120 is further illustrated in the figure. In the pixel 110 according to the first embodiment of the present technology, the respective units described above can be formed in, for example, a p-type well region 141 formed in an n-type semiconductor substrate. The overflow gate 117, the photoelectric conversion unit 111, the generated charge transferring unit 112, the generated charge retaining unit 115, the retained charge distributing unit 113, the output charge retaining unit 116, and the charge discharging unit 114 are formed in this well region 141 in the order mentioned.

The photoelectric conversion unit 111 is formed by a photodiode (PD) having a pn junction at a boundary surface between the n-type semiconductor region 144 formed in the well region 141 and a p-type semiconductor region around the n-type semiconductor region 144. When light enters the pn junction part, charge is generated. Electrons out of the generated charge are accumulated in the n-type semiconductor region 144. The n-type semiconductor region 144 is formed to have an impurity concentration lower than that of an n-type semiconductor region 146, for example, $10^{16}/cm^3$. The n-type semiconductor region 146 will be described later. Note that a p-type semiconductor region 145 having a high impurity concentration is formed on the n-type semiconductor region 144. The p-type semiconductor region 145 suppresses a dark current caused by an interface state by pinning a boundary surface of the semiconductor.

The generated charge retaining unit 115 is formed by an n-type semiconductor region 146 formed in the well region 141 and operates as a charge retaining region (C1). A generated charge retaining gate 133 is arranged over the n-type semiconductor region 146 via a silicon oxide film 153. In addition, the n-type semiconductor region 146 is formed to have an impurity concentration of, for example, $10^{18}$ to $10^{19}/cm^3$. The n-type semiconductor region 146 has a higher impurity concentration than that of the n-type semiconductor region 144 of the photoelectric conversion unit 111, and therefore has a higher potential than that of the n-type semiconductor region 144. Note that a negative bias voltage of about −1 V, for example, can be applied to the generated charge retaining gate 133. This is for performing pinning by forming a hole accumulation region between the n-type semiconductor region 146 and the silicon oxide film 153.

The generated charge transferring unit 112 is formed by using a p-type semiconductor region between the photoelectric conversion unit 111 and the generated charge retaining unit 115 as a channel region, and arranging a gate 132 over the channel region via a silicon oxide film 152. Furthermore, this gate 132 is connected to the generated charge retaining gate 133. When a positive voltage is applied to the gate 132, the generated charge transferring unit 112 is rendered conductive. As a result of this, the charge accumulated in the n-type semiconductor region 144 of the photoelectric conversion unit 111 is transferred to the n-type semiconductor region 146 of the generated charge retaining unit 115. In this manner, the generated charge transferring unit 112 is equivalent to a MOS transistor having the n-type semiconductor regions 144 and 146 as a source region and a drain region, respectively. Furthermore, the generated charge retaining unit 115 can be regarded as formed in a source region of this MOS transistor.

The output charge retaining unit 116 is formed by an n-type semiconductor region 147 formed in the well region 141. The n-type semiconductor region 147 is called a floating diffusion (FD), a region to which the signal generating unit 120 is connected. The n-type semiconductor region 147 is formed to have substantially the same impurity concentration as that of the n-type semiconductor region 146 of the generated charge retaining unit 115. Therefore, the n-type semiconductor region 147 of the output charge retaining unit 116 and the n-type semiconductor region 146 of the generated charge retaining unit 115 have potential of the same height. Note that a region (not illustrated) for wiring with the signal generating unit 120 needs to be enhanced in terms of the impurity concentration to, for example, $10^{21}/cm^3$. This is for reducing resistance at a junction part with the wiring.

The retained charge distributing unit 113 has a p-type semiconductor region between the generated charge retaining unit 115 and the output charge retaining unit 116 as a channel region, and a gate 134 is arranged over the channel region via a silicon oxide film 154. When a positive voltage is applied to the gate 134, the retained charge distributing unit 113 is rendered conductive. As a result of this, the charge retained in the n-type semiconductor region 146 of the generated charge retaining unit 115 is uniformly distributed to the n-type semiconductor region 146 of the generated charge retaining unit 115 and the n-type semiconductor region 147 of the output charge retaining unit 116.

The charge discharging unit 114 has a p-type semiconductor region between the n-type semiconductor region 147 and the n-type semiconductor region 148 of the output charge retaining unit 116 as a channel region, and a gate 135 is formed over the channel region via a silicon oxide film 155. When a positive voltage is applied to this gate 135, the charge discharging unit 114 is rendered conductive. Since the n-type semiconductor region 148 is connected with Vdd, the charge retained in the n-type semiconductor region 147 of the output charge retaining unit 116 is discharged to Vdd.

The overflow gate 117 has a p-type semiconductor region between the n-type semiconductor region 144 and the n-type semiconductor region 143 of the photoelectric conversion unit 111 as a channel region, and a gate 131 is arranged above the channel region via the silicon oxide film 151. When a positive voltage is applied to this gate 131, the overflow gate 117 is rendered conductive. Since the n-type semiconductor region 143 is connected with Vdd, the charge retained in the n-type semiconductor region 144 of the photoelectric conversion unit 111 is discharged to Vdd.

In addition to these elements, a wiring layer, an interlayer insulating layer, light shielding metal, and other layers are arranged in the pixel 110. Note that the light shielding metal shields the generated charge transferring unit 112, the generated charge retaining unit 115, and the retained charge distributing unit 113 and thereby reduces a dark current flowing therein.

Note that, in the example described above, the impurity concentration in the n-type semiconductor region 147 of the output charge retaining unit 116 is set to $10^{18}$ to $10^{19}/cm^3$ which is the same as the impurity concentration in the n-type semiconductor region 146 of the generated charge retaining unit 115. However, for example, the impurity concentration may be set to $10^{21}/cm^3$.

Also in this case, the n-type semiconductor region 147 and the n-type semiconductor region 146 can have substantially the same potential. Therefore, when the retained charge distributing unit 113 is rendered conductive, the charge retained in the generated charge retaining unit 115 is uniformly distributed to the generated charge retaining unit 115 and the output charge retaining unit 116.

[Driving Method of Imaging Device]

Figure 6:
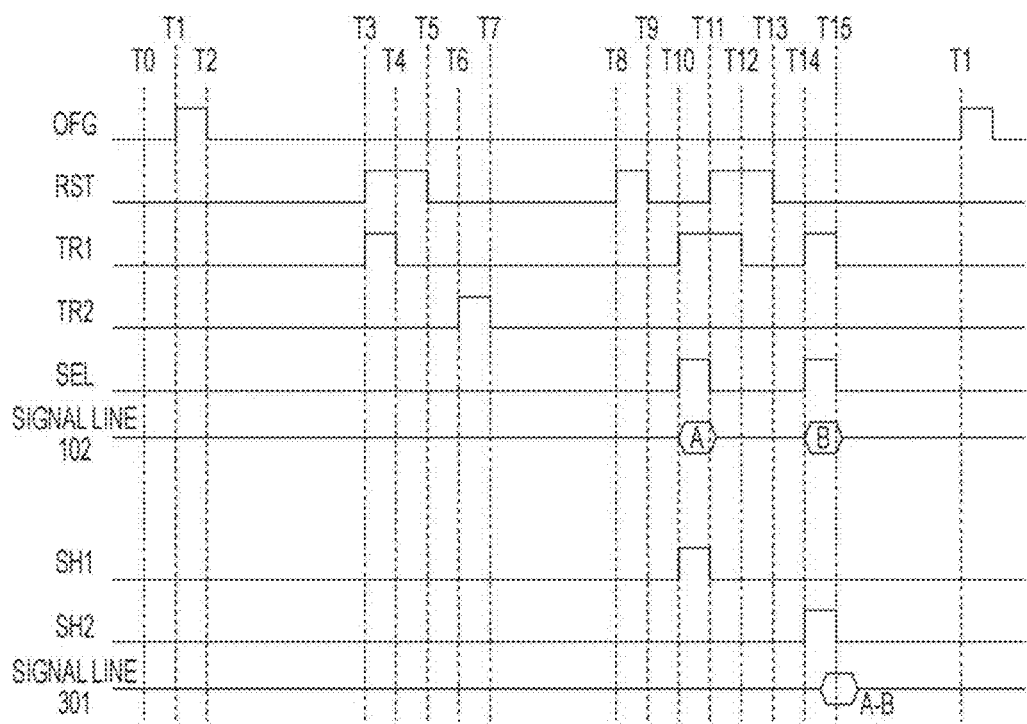
FIG. 6 is a diagram exemplifying a driving method of an imaging device 10 according to the first embodiment of the present technology.

FIG. 6 is a diagram exemplifying a driving method of the imaging device 10 according to the first embodiment of the present technology. The figure is a time chart illustrating signals of the input signal lines (OFG, RST, TR1, TR2, SEL, SH1 and SH2) and the output signal lines (signal line 102 and signal line 301) in the imaging device 10. A state of each of the input signal lines in the figure is represented by a value "0" or "1". A value "0" represents a state in which no ON signal is input, and a value "1" represents a state in which an ON signal is input. In the figure, in periods T0 to T7 all the pixels 110 of the pixel array unit 100 are simultaneously driven, and in periods T8 to T15 the pixels 110 of the pixel array unit 100 are sequentially driven row by row.

[Periods T0 to T7] FIGS. 7a, 7b, 7c, 7d and 7e are diagrams illustrating operation states (periods T0 to T4) of the pixel 110 according to the first embodiment of the present technology. Also, FIGS. 8f, 8q and 8h are diagrams illustrating operation states (periods T5 to T7) of the pixel 110 according to the first embodiment of the present technology. These figures are potential diagrams illustrating operation states of the pixel 110 corresponding to the periods T0 to T4 and the periods T5 to T7 in FIG. 6. In addition, in these figures, states of the photoelectric conversion unit 111, the generated charge transferring unit 112, the retained charge distributing unit 113, the charge discharging unit 114, the generated charge retaining unit 115, the output charge retaining unit 116, and the overflow gate 117 are illustrated. Note that these arrangements are the same as those in the semiconductor substrate described of FIG. 5.

Figure 7A:
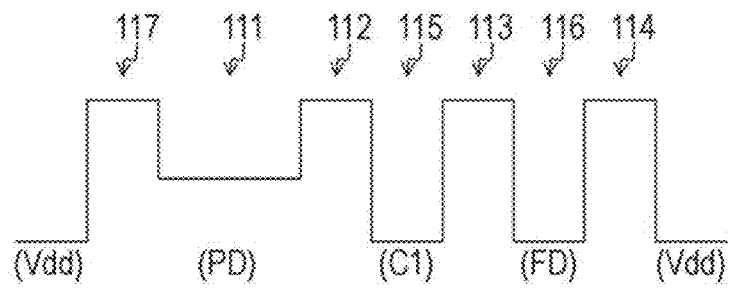
FIGS. 7a, 7b, 7c, 7d and 7e are diagrams illustrating operation states (periods T0 to T4) of the pixel 110 according to the first embodiment of the present technology.
Figure 7B:
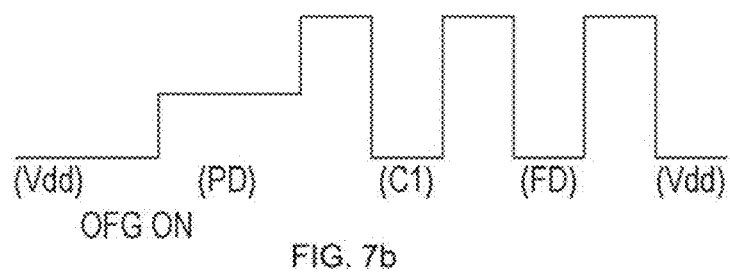
Figure 7C:
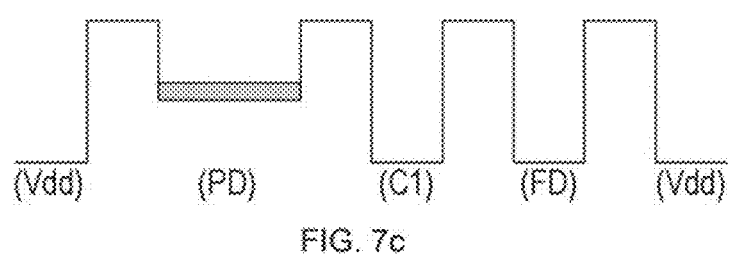
Figure 7D:
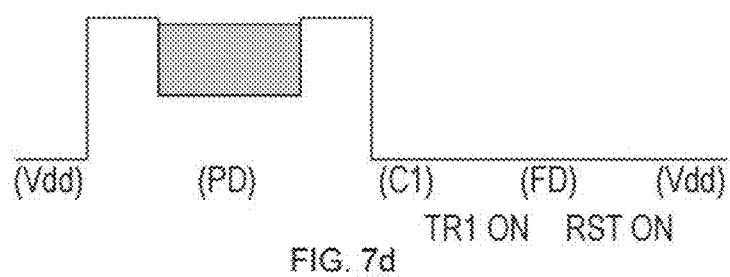
Figure 7E:
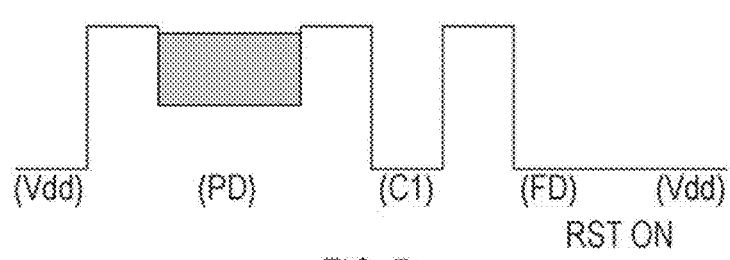
Figure 8F:
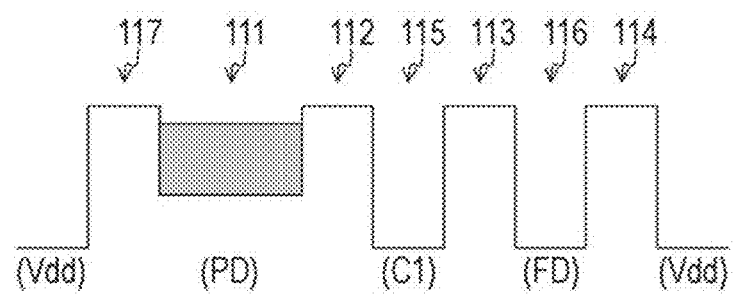
FIGS. 8f, 8g and 8h are diagrams illustrating operation states (periods T5 to T7) of the pixel 110 according to the first embodiment of the present technology.

In a standby state before exposure is started, no input signal is applied to the generated charge transferring unit 112, the retained charge distributing unit 113, the charge discharging unit 114, and the overflow gate 117, which are thus in a non-conductive state (T0 in FIG. 6, FIG. 7a).

Next, an ON signal is input to OFG to render the overflow gate 117 conductive. As a result of this, the charge accumulated in the photoelectric conversion unit 111 is discharged (T1 in FIG. 6, FIG. 7b).

After this charge is discharged, the overflow gate 117 is rendered non-conductive. As a result of this, so-called resetting is performed, and exposure is started simultaneously in all the pixels 110. Charge corresponding to an exposure amount (shaded areas in FIGS. 7a, 7b, 7c, 7d, and 7e) is accumulated in the photoelectric conversion unit 111 (T2 in FIG. 6, FIG. 7c).

After a predetermined exposure period has elapsed, an ON signal is input to RST and TR1 to render the retained charge distributing unit 113 and the charge discharging unit 114 conductive. As a result of this, charge based on the dark current accumulated in the generated charge retaining unit 115 and the output charge retaining unit 116 is discharged (T3 in FIG. 6, FIG. 7d).

Next, the retained charge distributing unit 113 is rendered non-conductive (T4 in FIG. 6, FIG. 7e), and the charge discharging unit 114 is rendered non-conductive (T5 in FIG. 6, FIG. 8f).

Figure 8G:
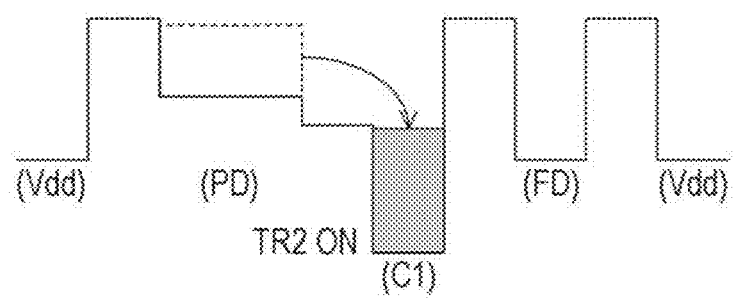
Figure 8H:
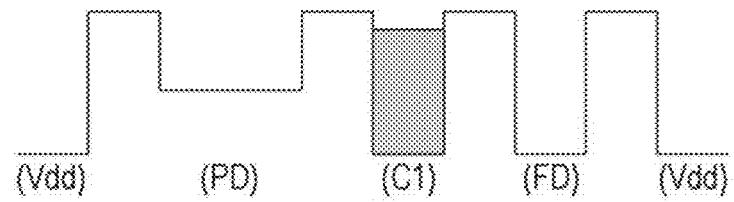

Next, an ON signal is input to TR2 to render the generated charge transferring unit 112 conductive, and the charge accumulated in the photoelectric conversion unit 111 is transferred to the generated charge retaining unit 115 (T6 in FIG. 6, FIG. 8g). Thereafter, the generated charge transferring unit 112 is rendered non-conductive. As a result of this, exposure is simultaneously stopped in all the pixels 110 (T7 in FIG. 6, FIG. 8h).

[Periods T8 to T15] FIGS. 9a, 9b, 9c, 9d and 9e are diagrams illustrating operation states (periods T8 to T12) of the pixel 110 according to the first embodiment of the present technology. Also, FIGS. 10f and 10d are diagrams illustrating operation states (periods T13 to T14) of the pixel 110 according to the first embodiment of the present technology.

Figure 9A:
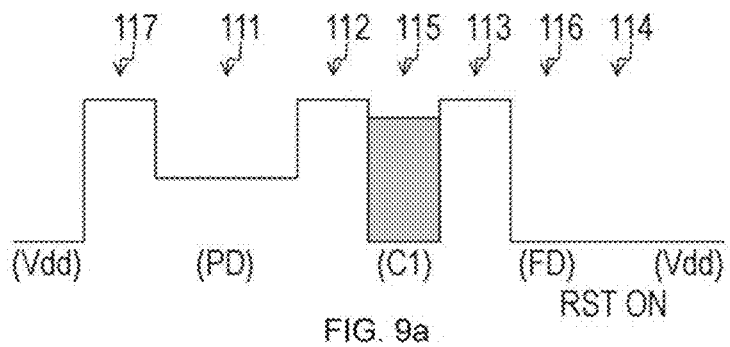
FIGS. 9a, 9b, 9c, 9d and 9e are diagrams illustrating operation states (periods T8 to T12) of the pixel 110 according to the first embodiment of the present technology.
Figure 9B:
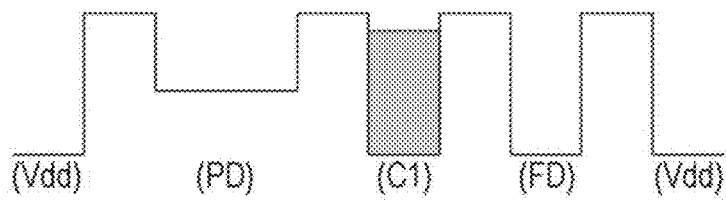
Figure 9C:
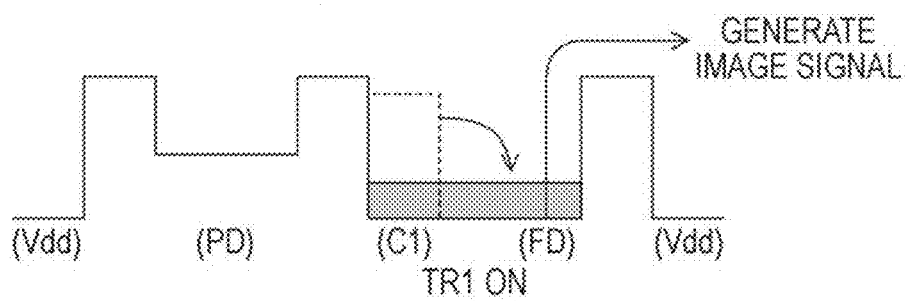
Figure 9D:
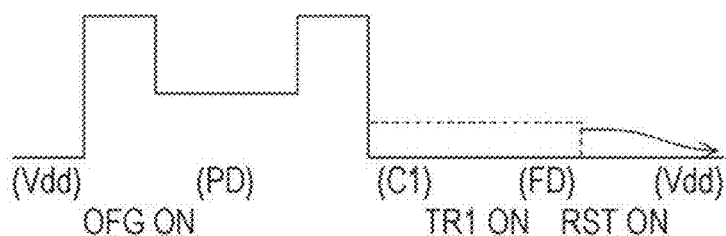
Figure 10F:
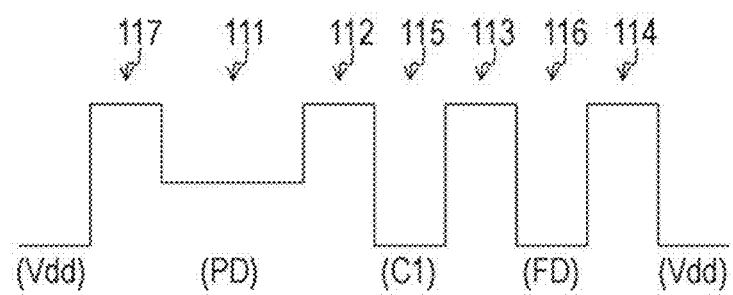
FIGS. 10f and 10d are diagrams illustrating operation states (periods T13 to T14) of the pixel 110 according to the first embodiment of the present technology.

Subsequent to the period T7, an ON signal is input to RST to render the charge discharging unit 114 conductive (T8 in FIG. 6, FIG. 9a). As a result of this, charge based on the dark current accumulated in the output charge retaining unit 116 is discharged. Thereafter, the charge discharging unit 114 is rendered non-conductive (T9 in FIG. 6, FIG. 9b).

Next, an ON signal is input to TR1 and SEL to render the retained charge distributing unit 113 and the MOS transistor 122 conductive. As a result of this, the charge retained in the generated charge retaining unit 115 is uniformly distributed to the generated charge retaining unit 115 and the output charge retaining unit 116, and an image signal (denoted by "A" in FIG. 6) is generated and output to the signal line 102. Furthermore, by inputting an ON signal to SH1, the image signal output to the signal line 102 is sampled by the sample-and-hold circuit 321 of the signal processing unit 320 (T10 in FIG. 6, FIG. 9c).

Next, in a state where an ON signal is input to TR1, an ON signal is input to RST to render the retained charge distributing unit 113 and the charge discharging unit 114 conductive. As a result of this, the charge retained in the generated charge retaining unit 115 and the output charge retaining unit 116 is discharged (T11 in FIG. 6, FIG. 9d). Note that, upon transition from the period T10 to the period T11, input of the ON signal at SH1 is stopped. As a result of this, the image signal (A) output to the signal line 102 is held in the sample-and-hold circuit 321.

Figure 9E:
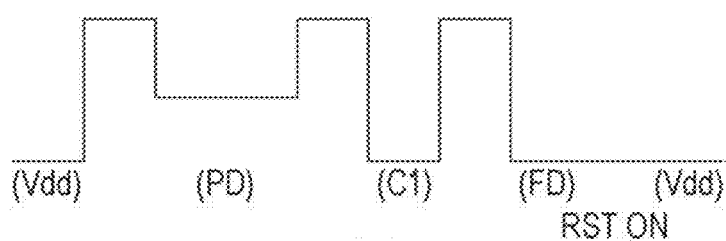

Next, the retained charge distributing unit 113 is rendered non-conductive (T12 in FIG. 6, FIG. 9e). Furthermore, the charge discharging unit 114 is rendered non-conductive (T13 in FIG. 6, FIG. 10f).

Figure 10G:
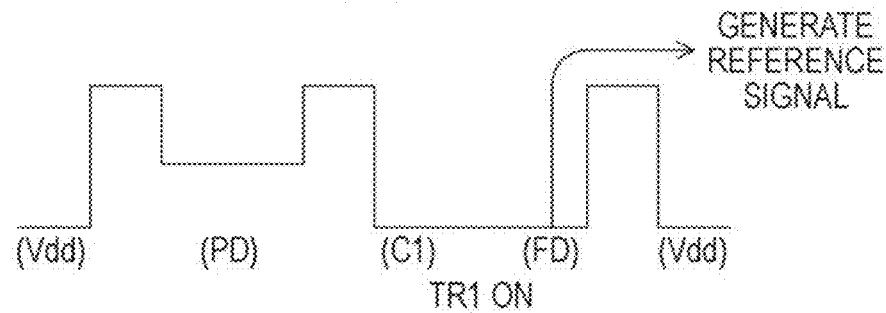

Next, an ON signal is input to TR1 and SEL to render the retained charge distributing unit 113 and the MOS transistor 122 conductive. As a result of this, a reference signal (denoted by "B" in FIG. 6) is output to the signal line 102. Furthermore, by inputting an ON signal to SH2, the reference signal output to the signal line 102 is sampled by the sample-and-hold circuit 322 of the signal processing unit 320 (T14 in FIG. 6, FIG. 10g). Note that immediately before generation of the reference signal, the retained charge distributing unit 113 is temporarily rendered non-conductive (T12 in FIG. 6) and then rendered conductive (T14 in FIG. 6). As a result of this, similar noise to that at the time of generating the image signal is superimposed on the reference signal.

Next, the retained charge distributing unit 113 and the MOS transistor 122 are rendered non-conductive (T15 in FIG. 6). Also, upon transition from the period T14 to the period T15, input of the ON signal at SH2 is stopped. As a result of this, the reference signal (B) output to the signal line 102 by held in the sample-and-hold circuit 322. Note that subtraction (A □ B) is performed by the subtractor 323 of the signal processing unit 320, and a result of the calculation is output to the signal line 301. As a result of this, processing of image signals of one row is completed.

By performing the processing of the periods T8 to T14 for all the rows of the pixel array unit 100, transfer of image signals in one frame is completed. After a stationary state, transition to processing in the period T1 is performed, whereby exposure of a next frame is started.

In this manner, in the first embodiment of the present technology, charge is uniformly distributed to the generated charge retaining unit 115 and the output charge retaining unit 116, and an image signal is thereby generated. Furthermore, an impurity concentration of the n-type semiconductor region 146 of the generated charge retaining unit 115 is substantially the same as that of the n-type semiconductor region 147 of the output charge retaining unit 116. This allows a capacity per unit area of the n-type semiconductor region 146 to be increased and an area of the generated charge retaining unit 115 to be reduced.

2. Second Embodiment

In the above embodiment, all the pixels 110 include the output charge retaining unit 116, the charge discharging unit 114, and the signal generating unit 120. Meanwhile in a second embodiment of the present technology, these are shared by two pixels 110.

[Configuration of Imaging Device]

Figure 11:
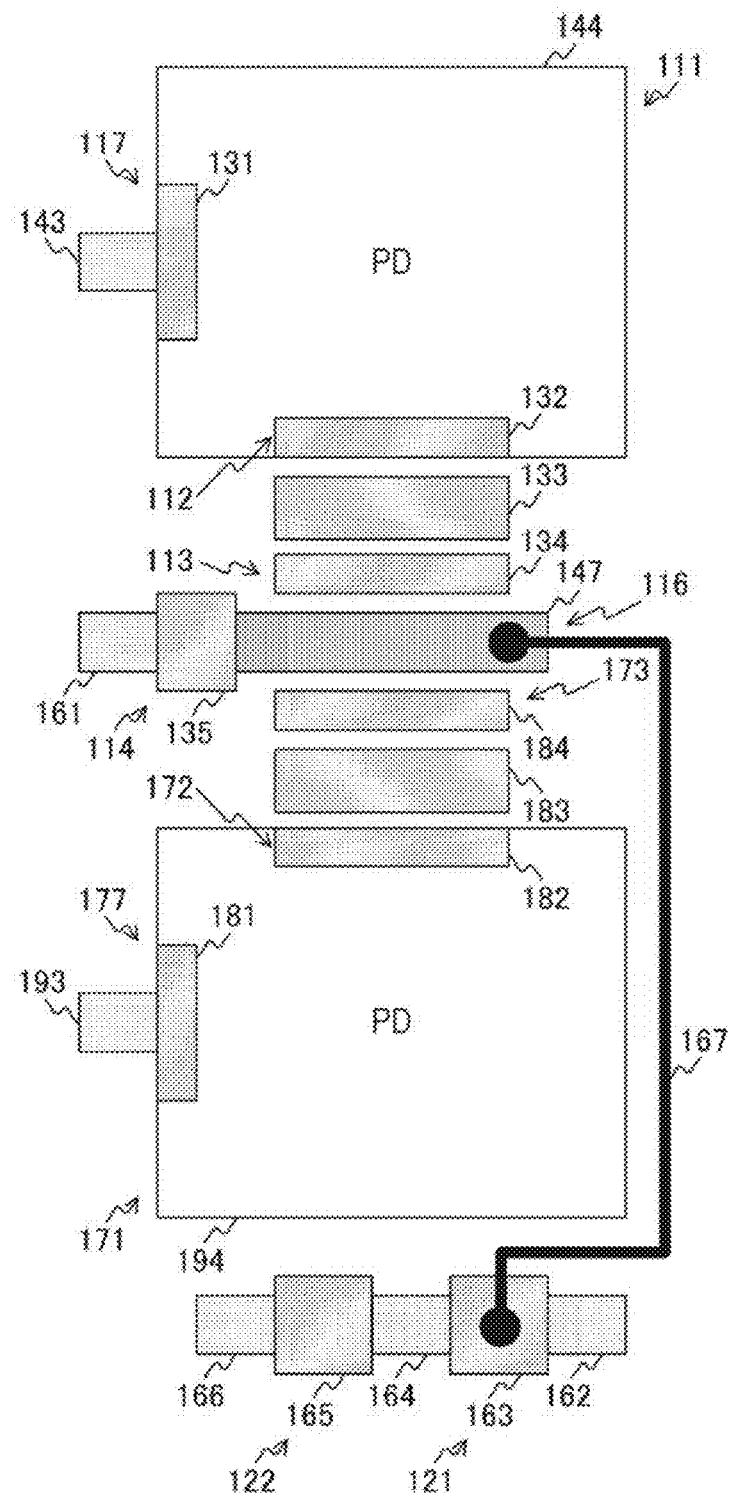
FIG. 11 is a schematic diagram illustrating a configuration example of a pixel according to a second embodiment of the present technology.

FIG. 11 is a schematic diagram illustrating a configuration example of a pixel according to the second embodiment of the present technology. The figure illustrates arrangement of pixels on a surface of a semiconductor substrate. The pixels in the figure include a first pixel and a second pixel connected to an output charge retaining unit of the first pixel. The pixel 110 described of FIG. 3 can be applied as the first pixel. Furthermore, as the second pixel, a pixel including a photoelectric conversion unit 171, a generated charge transferring unit 172, a generated charge retaining unit 175 (not illustrated), a retained charge distributing unit 173, and an overflow gate 177 can be used.

In the center of the figure, an n-type semiconductor region 147 of an output charge retaining unit 116 is arranged, and two pixels are arranged above and below the center in the drawing. A gate 134 of a retained charge distributing unit 113 and a gate 133 of a generated charge retaining unit 115 are arranged adjacent to each other in order above the output charge retaining unit 116. Furthermore, above the gate 133, a gate 132 of a generated charge transferring unit 112 and an n-type semiconductor region 144 of a photoelectric conversion unit 111 are arranged adjacent to each other in order. In addition, a gate 131 and an n-type semiconductor region 143 of the overflow gate 117 are arranged adjacent to each other in order on the left side of the photoelectric conversion unit 111.

Meanwhile, a gate 184 of the retained charge distributing unit 173 and a gate 183 of the generated charge retaining unit 175 are arranged adjacent to each other in order below the output charge retaining unit 116. Furthermore, below the generated charge retaining gate 183, a gate 182 of the generated charge transferring unit 172 and an n-type semiconductor region 194 of the photoelectric conversion unit 171 are arranged adjacent to each other in order. In addition, a gate 181 and an n-type semiconductor region 193 of the overflow gate 177 are arranged adjacent to each other in order on the left side of the photoelectric conversion unit 171.

A gate 135 and an n-type semiconductor region 161 of a charge discharging unit 114 are arranged in order on the left side of the output charge retaining unit 116. Furthermore, below the photoelectric conversion unit 171, MOS transistors 121 and 122 that form a signal generating unit 120 are connected in series. The MOS transistor 121 includes an n-type semiconductor region 162 corresponding to a drain, a gate 163, and an n-type semiconductor region 164 corresponding to a source. Furthermore, the MOS transistor 122 includes the n-type semiconductor region 164 corresponding to the drain and also serving as a source of the MOS transistor 121, a gate 165, and an n-type semiconductor region 166 corresponding to a source. The n-type semiconductor region 147 of the output charge retaining unit 116 and the gate 163 of the MOS transistor 121 are connected by wiring 167. Since the charge discharging unit 114 and the MOS transistor 122 are shared by the first pixel and the second pixel, signal lines (RST and SEL) for controlling them are similarly shared by the first pixel and the second pixel.

Other configurations of the pixel 110 and the an imaging device 10 are similar to those of the pixel 110 described of FIG. 3 and the imaging device 10 described in FIG. 1 and thus descriptions thereon are omitted.

As described above, since the output charge retaining unit 116, the charge discharging unit 114, and the signal generating unit 120 are shared by two pixels according to the second embodiment of the present technology, the pixel 110 can be downsized.

3. Third Embodiment

In the embodiment described above, the charge generated by the photoelectric conversion unit 111 is transferred to the generated charge retaining unit 115. On the other hand, in the third embodiment of the present technology, an auxiliary charge retaining unit is included. Charge generated by the photoelectric conversion unit 111 is transferred to the generated charge retaining unit 115 via the auxiliary charge retaining unit.

[Circuit Configuration of Pixel]

Figure 12:
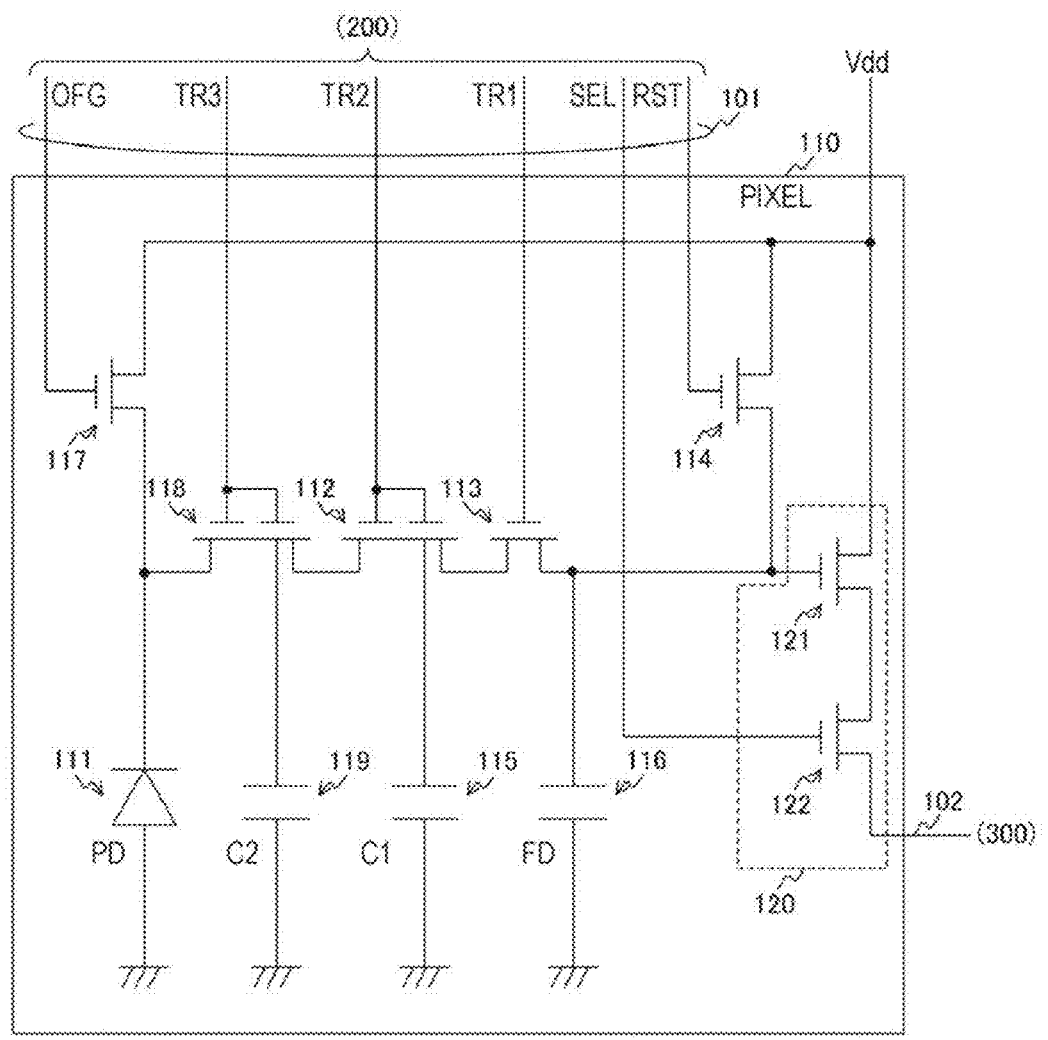
FIG. 12 is a diagram illustrating a configuration example of a pixel 110 according to a third embodiment of the present technology.

FIG. 12 is a diagram illustrating a configuration example of the pixel 110 according to a third embodiment of the present technology. The pixel 110 in the figure is different from the pixel 110 described in FIG. 2 in that it further includes an auxiliary charge transferring unit 118 and an auxiliary charge retaining unit 119. The auxiliary charge transferring unit 118 is formed by a MOS transistor. The auxiliary charge retaining unit 119 is arranged with a gate similarly to a generated charge retaining unit 115. Furthermore, signal lines 101 further includes a signal line Transfer 3 (TR3). This is a signal line for transmitting a control signal to the auxiliary charge transferring unit 118.

A source of the auxiliary charge transferring unit 118 is connected to a cathode of a photoelectric conversion unit 111 and a source of an overflow gate 117. A drain of the auxiliary charge transferring unit 118 is connected to a source of a generated charge transferring unit 112 and one end of the auxiliary charge retaining unit 119. The other end of the auxiliary charge retaining unit 119 is grounded. A gate of the auxiliary charge transferring unit 118 is connected to the TR3 signal line, and a gate of the auxiliary charge retaining unit 119 is connected to the gate of the auxiliary charge transferring unit 118.

The auxiliary charge transferring unit 118 is controlled by TR3 to transfer charge generated by the photoelectric conversion unit 111 to the auxiliary charge retaining unit 119. The auxiliary charge transferring unit 118 renders the photoelectric conversion unit 111 and the auxiliary charge retaining unit 119 conductive therebetween and thereby performs transfer of the charge.

The auxiliary charge retaining unit 119 retains the charge transferred by the auxiliary charge transferring unit 118. The auxiliary charge retaining unit 119 is formed in a source region of the auxiliary charge transferring unit 118. Furthermore, similarly to the generated charge retaining unit 115, potential can be controlled by the gate. As will be described later, this auxiliary charge retaining unit 119 is formed to have an impurity concentration lower than that of the generated charge retaining unit 115.

The generated charge transferring unit 112 transfers the charge retained in the auxiliary charge retaining unit 119 to the generated charge retaining unit 115.

Other configurations of the pixel 110 are similar to those of the pixel 110 described in FIG. 2 and thus descriptions thereon are omitted.

[Operation in Pixel]

In the third embodiment of the present technology, the charge generated by the photoelectric conversion unit 111 is transferred to the auxiliary charge retaining unit 119 and the generated charge retaining unit 115. Therefore, the auxiliary charge retaining unit 119 can have a smaller capacity than that of the generated charge retaining unit 115. In addition, the auxiliary charge retaining unit 119 is formed to have an impurity concentration lower than that of the generated charge retaining unit 115 and higher than that of the photoelectric conversion unit 111. Therefore, the magnitude of potential of the photoelectric conversion unit 111, the auxiliary charge retaining unit 119, and the generated charge retaining unit 115 are in the order mentioned. That is, potential is formed stepwise.

After a predetermined exposure time has elapsed, the auxiliary charge transferring unit 118 is rendered conductive to transfer the charge of the photoelectric conversion unit 111 to the auxiliary charge retaining unit 119 and to render the generated charge transferring unit 112 conductive. As a result of this, the charge generated by the photoelectric conversion unit 111 is retained in the auxiliary charge retaining unit 119. In a case where charge exceeding the capacity of the auxiliary charge retaining unit 119 is generated in the photoelectric conversion unit 111, the excessive charge is transferred to the generated charge retaining unit 115. The transfer by the generated charge transferring unit 112 performed in synchronization with the transfer by the auxiliary charge transferring unit 118 as described above is referred to as first transfer.

Next, a retained charge distributing unit 113 is rendered conductive to uniformly distribute the charge retained in the generated charge retaining unit 115 to the generated charge retaining unit 115 and an output charge retaining unit 116, and then the signal generating unit 120 generates an image signal. This distribution by the retained charge distributing unit 113 is referred to as first distribution, and the image signal generated by the signal generating unit 120 is referred to as a first image signal.

Next, the retained charge distributing unit 113 and the charge discharging unit 114 are rendered conductive to discharge the charge. Furthermore, the retained charge distributing unit 113 is temporarily rendered non-conductive and then rendered conductive for the signal generating unit 120 to generate a reference signal.

After generation of the reference signal, the generated charge transferring unit 112 is rendered conductive while the retained charge distributing unit 113 is kept in a conductive state, and the charge retained in the auxiliary charge retaining unit 119 is transferred to the generated charge retaining unit 115. Since the retained charge distributing unit 113 is in the conductive state, the charge transferred to the generated charge retaining unit 115 is uniformly distributed to the generated charge retaining unit 115 and the output charge retaining unit 116. This transfer by the generated charge transferring unit 112 and the distribution by the retained charge distributing unit 113 are referred to as second transfer and second distribution, respectively. Due to the second transfer by the generated charge transferring unit 112 and the second distribution by the retained charge distributing unit 113, the charge retained in the auxiliary charge retaining unit 119 is transferred to the generated charge retaining unit 115 and the output charge retaining unit 116.

As described above, since the potential between the auxiliary charge retaining unit 119 and the generated charge retaining unit 115 is in a stepwise manner, the auxiliary charge retaining unit 119 is depleted. That is, complete transfer is performed. Thereafter, an image signal is generated by the signal generating unit 120. The generated image signal is referred to as a second image signal. The sum of the first image signal and the second image signal forms an image signal based on the charge generated in the photoelectric conversion unit 111.

Upon generating the first image signal, a procedure for rendering the retained charge distributing unit 113 conductive immediately before is necessary. Therefore, noise is mixed in the first image signal. Meanwhile, the retained charge distributing unit 113 is kept in the conductive state from the generation of the reference signal to the generation of the second image signal described above. Since mixture of noise caused by conduction of the retained charge distributing unit 113 can be prevented, it is possible to generate a signal with a high accuracy when the second image signal is generated. In a case where the amount of incident light is small, charge generated in the photoelectric conversion unit 111 also decreases. In such a case, during the transfer by the auxiliary charge transferring unit 118 and the first transfer by the generated charge transferring unit 112 described above, the charge generated by the photoelectric conversion unit 111 is retained only in the auxiliary charge retaining unit 119. Thereafter, an image signal based on this charge is generated as a second image signal. Since the generation of the second image signal is performed with a high accuracy as described above, highly accurate imaging can be performed in an environment where the amount of incident light is small.

[Configuration of Signal Processing Unit]

Figure 13:
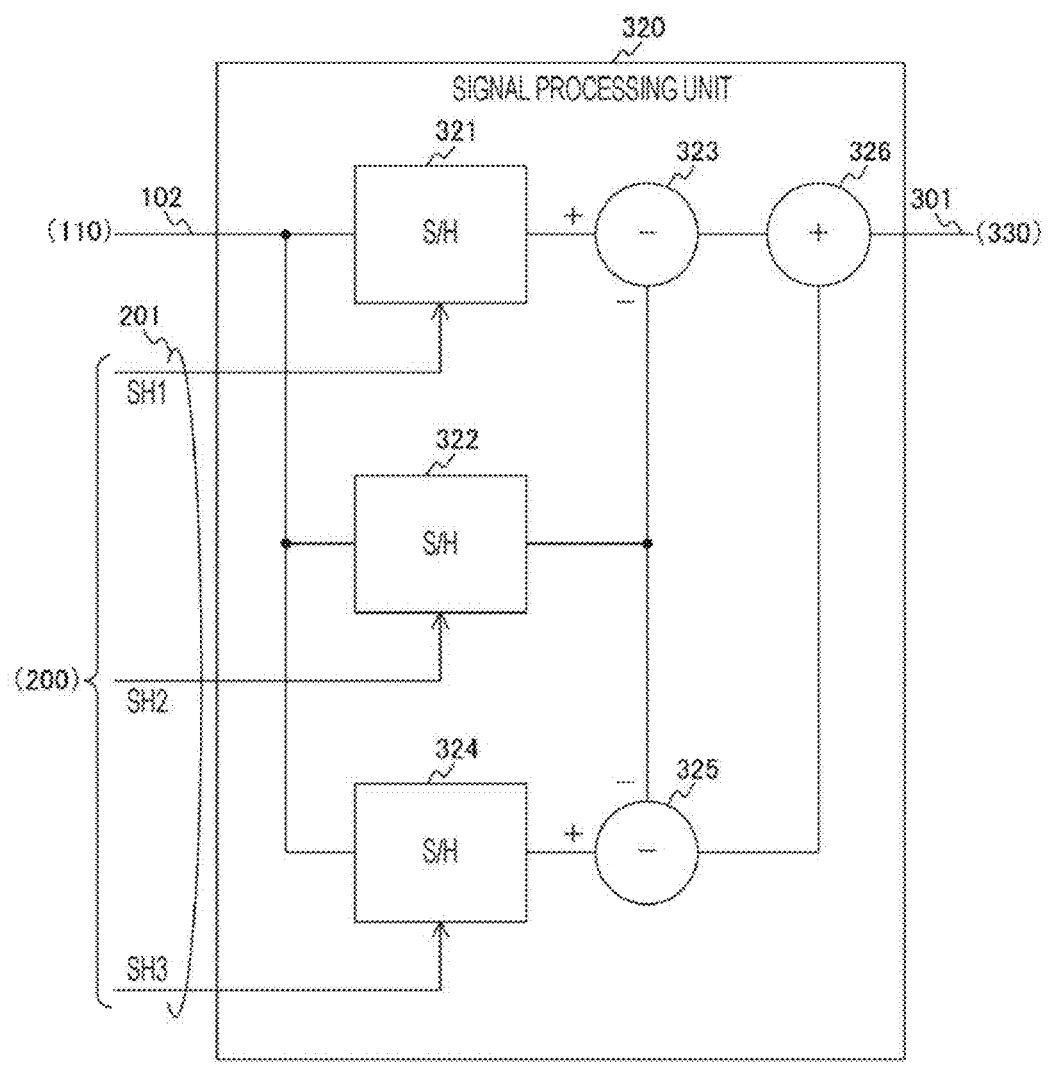
FIG. 13 is a diagram illustrating a configuration example of a signal processing unit 320 according to the third embodiment of the present technology.

FIG. 13 is a diagram illustrating a configuration example of a signal processing unit 320 according to the third embodiment of the present technology. The signal processing unit 320 is different from the signal processing unit 320 described in FIG. 4 in that it further includes a sample-and-hold circuit 324, a subtractor 325, and an adder 326. Furthermore, signal lines 201 further include a signal line SH3.

Sample-and-hold circuits 321, 322 and 324 in the figure perform sampling and holding of the first image signal, the reference signal and the second image signal, respectively. A signal line 102 is commonly connected to these inputs. In addition, SH3 is connected to the sample-and-hold circuit 324 for a control signal.

A subtractor 323 subtracts the reference signal held in the sample-and-hold circuit 322 from the first image signal held in the sample-and-hold circuit 321. The subtractor 325 subtracts the reference signal held in the sample-and-hold circuit 322 from the second image signal held in the sample-and-hold circuit 324. The adder 326 adds outputs from the subtractor 323 and the subtractor 325.

The adder 326 and the subtractors 323 and 325 perform a calculation of subtracting a value obtained by doubling the reference signal from a value obtained by adding the first image signal and the second image signal. As a result of this, an image signal removed of noise can be obtained.

Configurations other than the above are similar to those of the imaging device 10 according to the first embodiment of the present technology and thus descriptions thereon are omitted.

[Configuration of Pixel]

Figure 14:
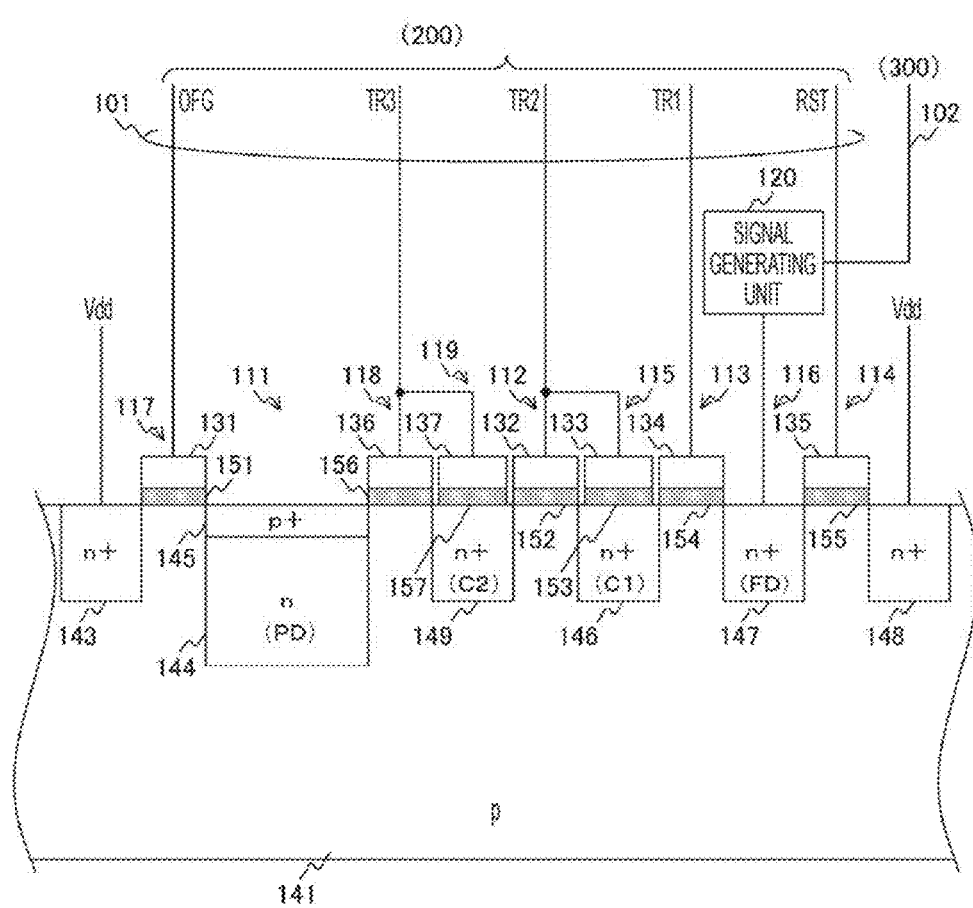
FIG. 14 is a schematic diagram illustrating a configuration example of the pixel 110 according to the third embodiment of the present technology.

FIG. 14 is a schematic diagram illustrating a configuration example of the pixel 110 according to the third embodiment of the present technology. The pixel 110 in the figure is different from the pixel 110 described in FIG. 5 in that it includes the auxiliary charge transferring unit 118 and the auxiliary charge retaining unit 119. The auxiliary charge transferring unit 118 and the auxiliary charge retaining unit 119 are arranged between the photoelectric conversion unit 111 and the generated charge transferring unit 112.

The auxiliary charge retaining unit 119 is formed by an n-type semiconductor region 149 formed in a well region 141 and operates as a charge retaining region (C 2). An auxiliary charge retaining gate 137 is arranged over the n-type semiconductor region 149 via a silicon oxide film 157. In addition, the n-type semiconductor region 149 is formed to have an impurity concentration of, for example, $10^{16}$ to $10^{17}/cm^3$. Since the n-type semiconductor region 149 is formed to have an impurity concentration intermediate between that of an n-type semiconductor region 144 of the photoelectric conversion unit 111 and that of an n-type semiconductor region 146 of the generated charge retaining unit 115, the stepwise potential as described above is formed.

The auxiliary charge transferring unit 118 is formed by using a p-type semiconductor region between the photoelectric conversion unit 111 and the auxiliary charge retaining unit 119 as a channel region, and arranging a gate 136 over the channel region via a silicon oxide film 156. Furthermore, the gate 136 is connected to the gate 137. When a positive voltage is applied to this gate 136, the auxiliary charge transferring unit 118 is rendered conductive. As a result of this, the charge accumulated in the n-type semiconductor region 144 of the photoelectric conversion unit 111 is transferred to the n-type semiconductor region 149 of the auxiliary charge retaining unit 119. In this manner, the auxiliary charge transferring unit 118 is equivalent to a MOS transistor having the n-type semiconductor regions 144 and 149 as a source region and a drain region, respectively. Furthermore, the auxiliary charge retaining unit 119 can be regarded as formed in a source region of this MOS transistor.

[Driving Method of Imaging Device]

Figure 15:
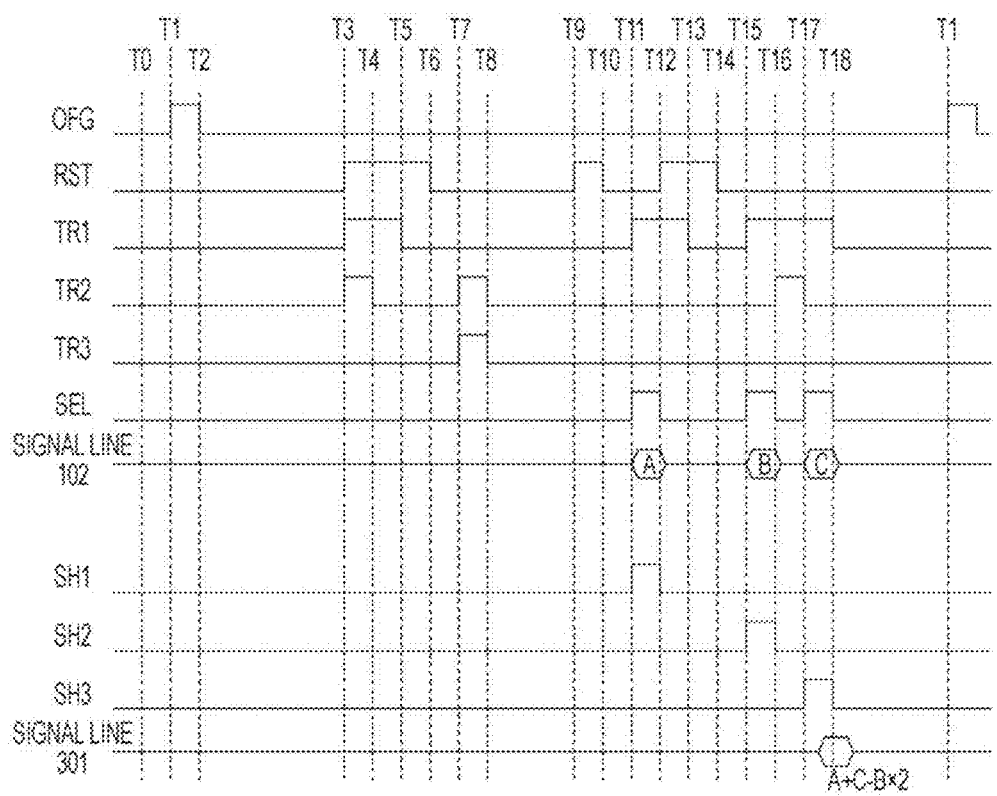
FIG. 15 is a diagram exemplifying a driving method of the imaging device 10 according to the third embodiment of the present technology.

FIG. 15 is a diagram exemplifying a driving method of the imaging device 10 according to the third embodiment of the present technology. The figure is a time chart illustrating signals of the input signal lines (OFG, RST, TR1, TR2, TR3, SEL, SH1, SH2 and SH3) and the output signal lines (signal line 102 and signal line 301) in the imaging device 10. In the figure, in periods T0 to T8 all the pixels 110 of the pixel array unit 100 are simultaneously driven, and in periods T9 to T18 the pixels 110 of the pixel array unit 100 are sequentially driven row by row.

[Periods T0 to T8] FIGS. 16a, 16b, 16c, 16d and 16e are diagrams illustrating operation states (periods T0 to T4) of the pixel 110 according to the third embodiment of the present technology. Also, FIGS. 17f, 17d, 17h and 17i are diagrams illustrating operation states (periods T5 to T8) of the pixel 110 according to the third embodiment of the present technology. These figures are potential diagrams illustrating operation states of the pixel 110 corresponding to the periods T0 to T4 and the periods T5 to T8 in FIG. 15. In addition, in these figures, states of the respective units arranged on the semiconductor substrate in FIG. 14 are illustrated.

Figure 16A:
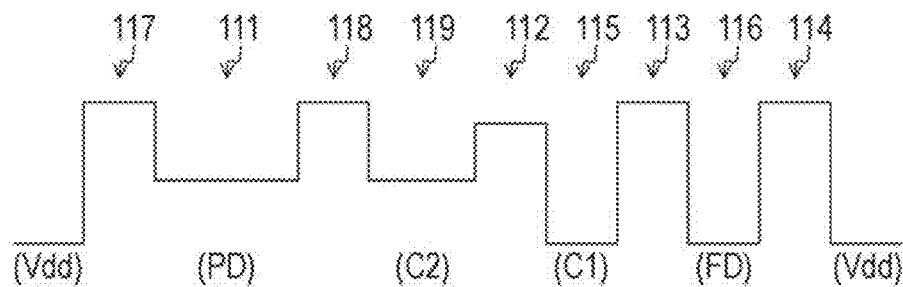
FIGS. 16a, 16b, 16c, 16d and 16e are diagrams illustrating operation states (periods T0 to T4) of the pixel 110 according to the third embodiment of the present technology.
Figure 16B:
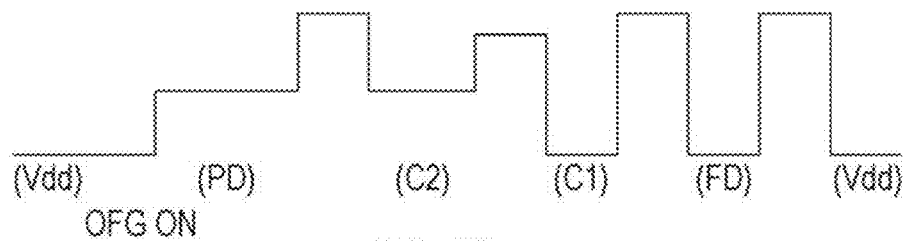
Figure 16C:
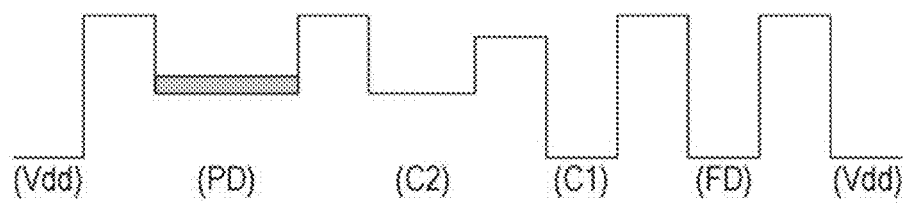
Figure 16D:
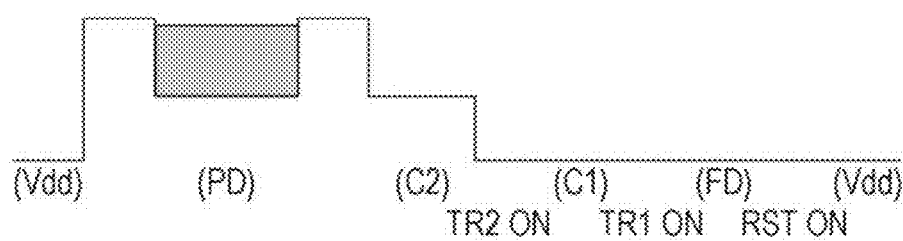
Figure 16E:
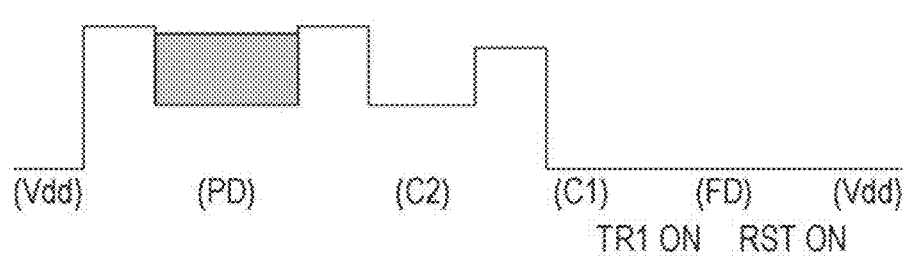

In a standby state before exposure is started, no input signal is applied to the auxiliary charge transferring unit 118, the generated charge transferring unit 112, the retained charge distributing unit 113, the charge discharging unit 114, and the overflow gate 117, which are thus in a non-conductive state (T0 in FIG. 15, a of FIG. 16a).

Next, an ON signal is input to OFG to render the overflow gate 117 conductive. As a result of this, the charge accumulated in the photoelectric conversion unit 111 is discharged (T1 in FIG. 15, FIG. 16b).

After this charge is discharged, the overflow gate 117 is rendered non-conductive. As a result of this, exposure is simultaneously started in all the pixels 110 (T2 in FIG. 15, FIG. 16c).

After a predetermined exposure period has elapsed, an ON signal is input to RST, TR1 and TR2 to render the generated charge transferring unit 112, the retained charge distributing unit 113 and the charge discharging unit 114 conductive. As a result of this, charge based on a dark current accumulated in the auxiliary charge retaining unit 119 and the generated charge retaining unit 115 is discharged (T3 in FIG. 15, FIG. 16d).

Figure 17F:
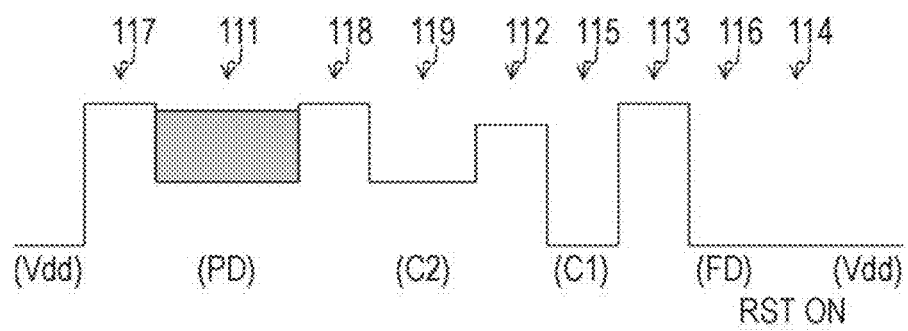
FIGS. 17f, 17d, 17h and 17i are diagrams illustrating operation states (periods T5 to T8) of the pixel 110 according to the third embodiment of the present technology.
Figure 17G:
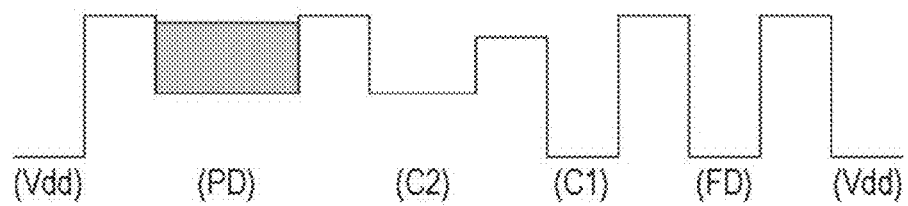
Figure 17H:
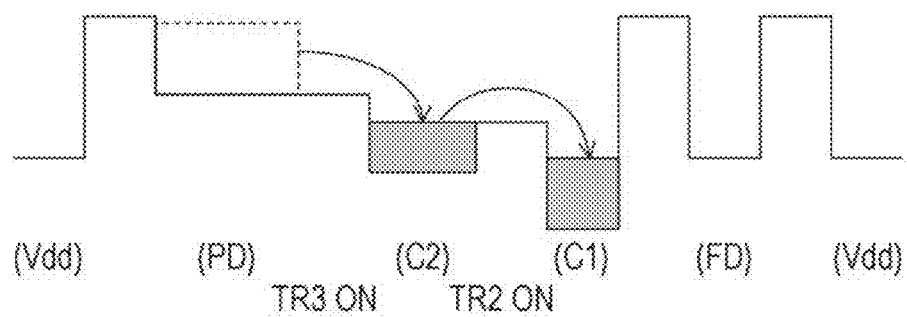
Figure 17I:
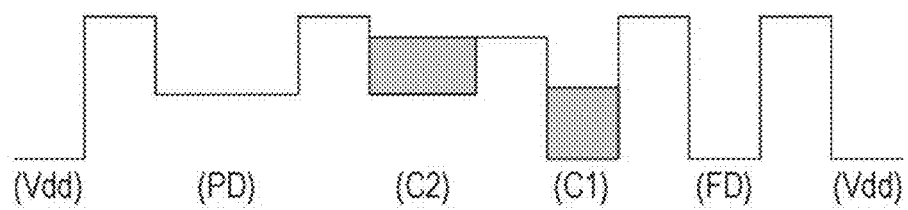

Next, the generated charge transferring unit 112 is rendered non-conductive (T 4 in FIG. 15, FIG. 16e), the retained charge distributing unit 113 is rendered non-conductive (T5 in FIG. 15, FIG. 17f), and the charge discharging unit 114 is rendered conductive (T 6 in FIG. 15, FIG. 17g).

Next, an ON signal is input to TR3 and TR2 to render the auxiliary charge transferring unit 118 and the generated charge transferring unit 112 conductive. As a result of this, the charge accumulated in the photoelectric conversion unit 111 is transferred to the auxiliary charge retaining unit 119 and the generated charge retaining unit 115 (T7 in FIG. 15, FIG. 17h). Note that this transfer by the generated charge transferring unit 112 corresponds to the first transfer by the generated charge transferring unit 112 described above. Thereafter, the auxiliary charge transferring unit 118 and the generated charge transferring unit 112 are rendered non-conductive. As a result of this, exposure is simultaneously stopped in all the pixels 110 (T8 in FIG. 15, FIG. 17i).

[Periods T9 to T18] FIGS. 18a, 18b, 18c, 18d and 18e are diagrams illustrating operation states (periods T9 to T13) of the pixel 110 according to the third embodiment of the present technology. Also, FIGS. 19f, 19q, 19h and 19i are diagrams illustrating operation states (periods T14 to T17) of the pixel 110 according to the third embodiment of the present technology.

Figure 18A:
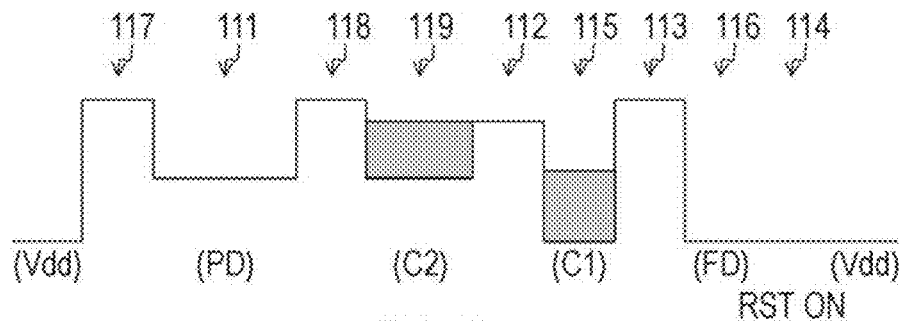
FIGS. 18a, 18b, 18c, 18d and 18e are diagrams illustrating operation states (periods T9 to T13) of the pixel 110 according to the third embodiment of the present technology.
Figure 18B:
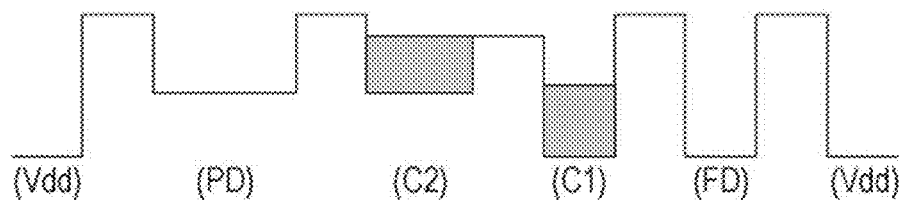
Figure 18C:
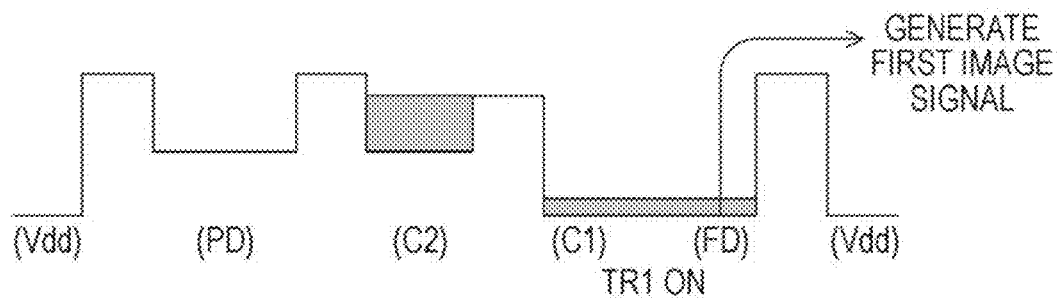
Figure 18D:
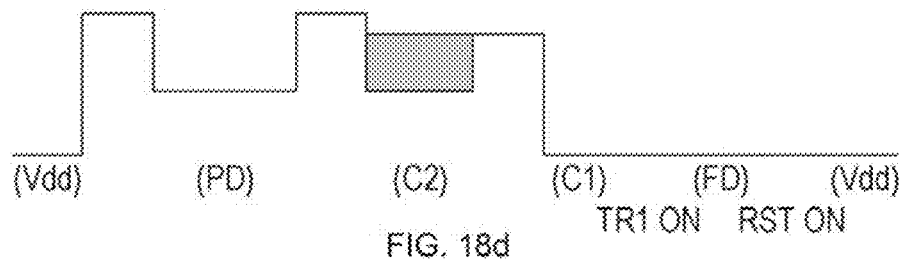
Figure 18E:
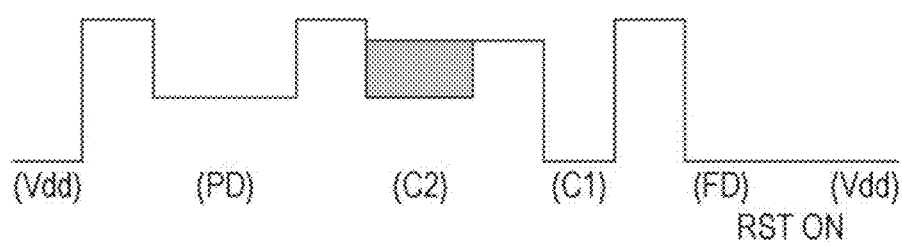

Subsequent to the period T 8, an ON signal is input to RST to render the charge discharging unit 114 conductive (T9 in FIG. 15, FIG. 18a). After the charge based on the dark current accumulated in the output charge retaining unit 116 is discharged, the charge discharging unit 114 is rendered non-conductive (T 10 in FIG. 15, FIG. 18b).

Next, an ON signal is input to TR1 and SEL to render the retained charge distributing unit 113 and the MOS transistor 122 conductive. As a result of this, the charge retained in the generated charge retaining unit 115 is uniformly distributed to the generated charge retaining unit 115 and the output charge retaining unit 116 (corresponds to the first distribution in the retained charge distributing unit 113), and the first image signal (A) is output to the signal line 102. Furthermore, by inputting an ON signal to SH1, the first image signal output to the signal line 102 is sampled in the sample-and-hold circuit 321 of the signal processing unit 320 (T 11 in FIG. 15, FIG. 18c).

Next, in a state where an ON signal is input to TR1, an ON signal is input to RST to render the retained charge distributing unit 113 and the charge discharging unit 114 conductive. As a result of this, the charge retained in the generated charge retaining unit 115 and the output charge retaining unit 116 is discharged (T12 in FIG. 15, FIG. 18d). Note that the input of the ON signal at SH1 is stopped upon transition from the period T11 to the period T12. As a result of this, the first image signal (A) output to the signal line 102 is held in the sample-and-hold circuit 321.

Figure 19F:
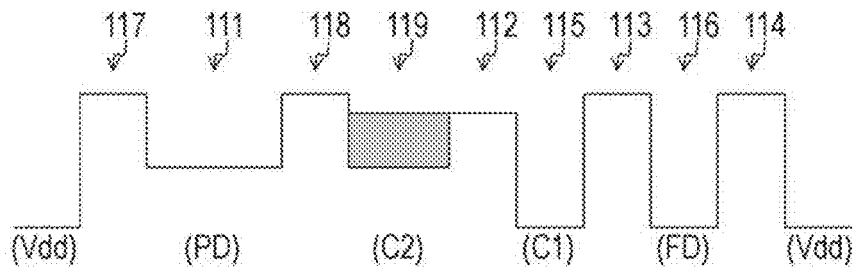
FIGS. 19f, 19d, 19h and 19i are diagrams illustrating operation states (periods T14 to T17) of the pixel 110 according to the third embodiment of the present technology.

Next, the retained charge distributing unit 113 is rendered non-conductive (T13 in FIG. 15, FIG. 18e), and the charge discharging unit 114 is rendered non-conductive (T14 in FIG. 15, FIG. 19f).

Figure 19G:
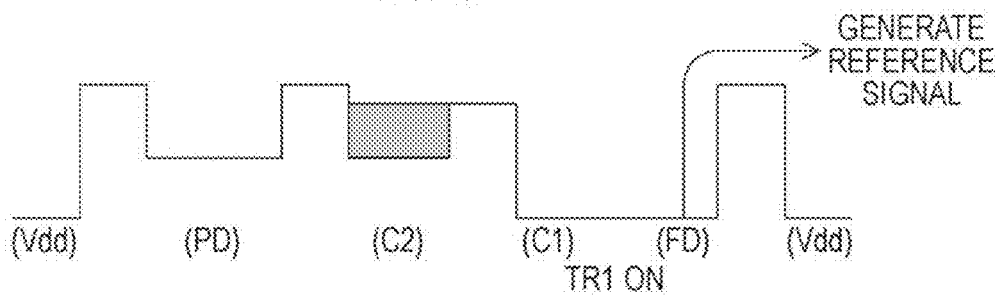
Figure 19H:
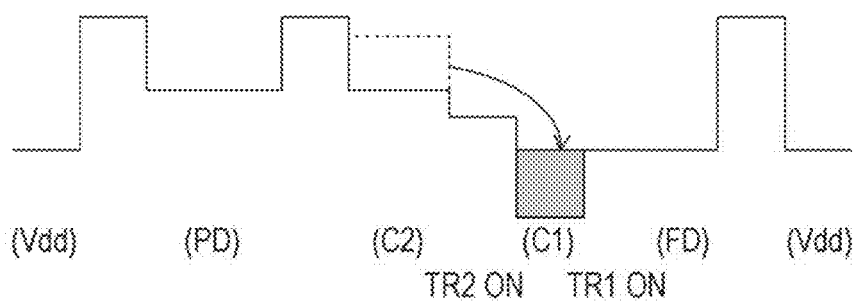
Figure 19I:
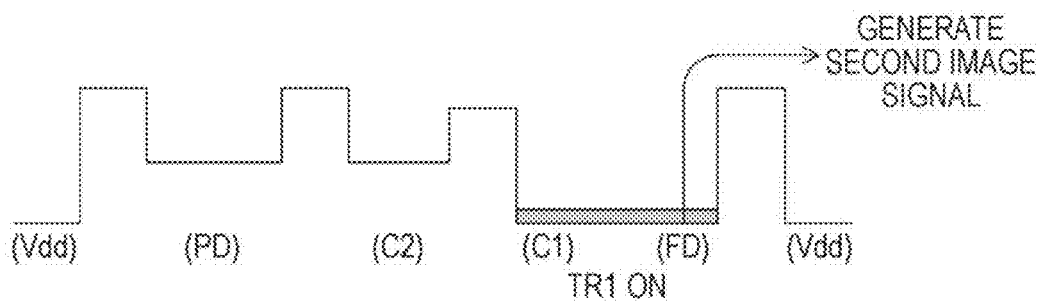

Next, an ON signal is input to TR1 and SEL to render the retained charge distributing unit 113 and the MOS transistor 122 conductive. As a result of this, a reference signal (B) is output to the signal line 102. Furthermore, by inputting an ON signal to SH2, the reference signal output to the signal line 102 is sampled by the sample-and-hold circuit 322 of the signal processing unit 320 (T15 in FIG. 15, FIG. 19g). Note that immediately before generation of the reference signal, the retained charge distributing unit 113 is temporarily rendered non-conductive (T13 in FIG. 15) and then rendered conductive (T15 in the figure). As a result of this, similar noise to that at the time of generating the first image signal is superimposed on the reference signal.

Next, an ON signal is input to TR2 to render the generated charge transferring unit 112 conductive (T16 in FIG. 15, FIG. 19h) while the retained charge distributing unit 113 is in a conductive state. As a result of this, the charge retained in the auxiliary charge retaining unit 119 is transferred to the generated charge retaining unit 115 (corresponds to the second transfer in the generated charge transferring unit 112). Note that the input of the ON signal at SH2 is stopped upon transition from the period T15 to the period T16, and the reference signal (B) output to the signal line 102 is held in the sample-and-hold circuit 322.

Next, the generated charge transferring unit 112 is rendered non-conductive and an ON signal is input to SEL to render the MOS transistor 122 conductive. Meanwhile, the retained charge distributing unit 113 is kept in the conductive state. As a result of this, the charge retained in the generated charge retaining unit 115 is uniformly distributed to the generated charge retaining unit 115 and the output charge retaining unit 116 (corresponds to the second distribution in the retained charge distributing unit 113), and the second image signal (C) is output to the signal line 102. Furthermore, by inputting an ON signal to SH3, the second image signal output to the signal line 102 is sampled in the sample-and-hold circuit 324 of the signal processing unit 320 (T17 in FIG. 15, FIG. 19i).

Next, the retained charge distributing unit 113 and the MOS transistor 122 are rendered non-conductive (T18 in FIG. 15). Also, upon transition from the period T17 to the period T18, input of the ON signal at SH3 is stopped. As a result of this, the second image signal (C) output to the signal line 102 is held in the sample-and-hold circuit 324. Thereafter, a calculation (A+C □ B×2) is performed by the subtractors 323 and 325 and the adder 326 of the signal processing unit 320, and the calculation result is output to the signal line 301. As a result of this, processing of image signals of one row is completed.

By performing the processing of the periods T9 to T17 for all the rows, transfer of image signals in one frame is completed. After a stationary state, transition to processing in the period T1 is performed, whereby exposure of a next frame is started.

As described above, in the third embodiment of the present technology, the auxiliary charge retaining unit 119 having the n-type semiconductor region 149 formed to have a lower impurity concentration than the that of the n-type semiconductor region 146 of the generated charge retaining unit 115 is included. Charge is retained in the auxiliary charge retaining unit 119 and the generated charge retaining unit 115. When an image signal based on the charge retained in the auxiliary charge retaining unit 119 is generated, it is not necessary to switch the retained charge distributing unit 113 between a conductive state and a non-conductive state. Therefore, influence of noise can be mitigated. Thus, imaging with a high accuracy can be performed in a low illuminance environment.

As described above, in the embodiments of the present technology, charge is uniformly distributed to the generated charge retaining unit 115 and the output charge retaining unit 116 to generate an image signal. Furthermore, by allowing the impurity concentration of the n-type semiconductor region 146 of the generated charge retaining unit 115 to be substantially the same as that of the n-type semiconductor region 147 of the output charge retaining unit 116, the capacity of the n-type semiconductor region 146 can be increased while the area of the generated charge retaining unit 115 can be reduced. Therefore, the pixel 110 and the imaging device 10 can be downsized.

Note that the embodiments described above illustrate an example for embodying the present technology, and matters of the embodiments and matters specifying the invention in the claims correspond with each other. Likewise, matters specifying the invention in the claims and matters of the embodiments of the present technology denoted by the same names as those thereof correspond with each other. However, the present technology is not limited to the embodiments, and can be embodied by applying various modifications to the embodiments without departing from the principles thereof.

In addition, the processing procedure described in the above embodiments may be regarded as a method having a series of the procedures, or as a program for causing a computer to execute a series of the procedures or as a recording medium for storing the program. As this recording medium, for example, a compact disc (CD), a mini disc (MD), a digital versatile disc (DVD), a memory card, a Blu-ray (registered trademark) disc, or the like may be used.

Note that the effects described herein are merely examples and thus are limited. Other effects may also be included.

Note that the present technology may employ configurations as follows.

(1) A solid-state imaging device, including:
a photoelectric conversion unit for generating charge corresponding to an exposure amount in a predetermined exposure period;
a generated charge retaining unit for retaining the charge, the generated charge retaining unit being formed in a semiconductor substrate to have a predetermined impurity concentration;
a generated charge transferring unit for rendering the photoelectric conversion unit and the generated charge retaining unit conductive therebetween after the exposure period has elapsed and transferring the charge from the photoelectric conversion unit to the generated charge retaining unit;
an output charge retaining unit for retaining the charge, the output charge retaining unit being formed to have substantially the same impurity concentration as that of the generated charge retaining unit;
a retained charge distributing unit for rendering the generated charge retaining unit and the output charge retaining unit conductive therebetween to uniformly distribute the charge retained in the generated charge retaining unit to the generated charge retaining unit and the output charge retaining unit; and
a signal generating unit for generating a signal corresponding to the charge retained in the output charge retaining unit as an image signal after the distribution in the retained charge distributing unit.

(2) The solid-state imaging device according to (1), further including:
a charge discharging unit for discharging the charge retained in the output charge retaining unit after generation of the image signal in the signal generating unit,
in which the signal generating unit further generates the signal as a reference signal after the discharge in the charge discharging unit, and
the retained charge distributing unit further performs the distribution at the time of the discharge in the charge discharging unit and at the time of generating the reference signal in the signal generating unit.

(3) The solid-state imaging device according to (2),
in which the retained charge distributing unit temporarily renders the generated charge retaining unit and the output charge retaining unit conductive therebetween during a period between the discharge in the charge discharging unit and the generation of the reference signal in the signal generating unit and then renders conductive therebetween.

(4) The solid-state imaging device according to (2) or (3), further including:
a signal processing unit for subtracting the reference signal from the image signal.

(5) The solid-state imaging device according to any one of (1) to (3), further including:
a generated charge retaining gate unit for controlling potential of the generated charge retaining unit,
in which the generated charge transferring unit includes a generated charge transferring gate unit for controlling the conduction, and
the generated charge transferring gate unit is connected to the generated charge retaining gate unit.

(6) The solid-state imaging device according to (1), further including:
an auxiliary charge retaining unit for retaining the charge, the auxiliary charge retaining unit being formed to have an impurity concentration lower than that of the generated charge retaining unit; and
an auxiliary charge transferring unit for rendering the photoelectric conversion unit and the auxiliary charge retaining unit conductive therebetween after the exposure period has elapsed and transferring the charge from the photoelectric conversion unit to the auxiliary charge retaining unit,
in which the generated charge transferring unit performs transfer of the charge retained in the auxiliary charge retaining unit to the generated charge retaining unit executed by rendering the auxiliary charge retaining unit and the generated charge retaining unit conductive therebetween as first transfer synchronized with the transfer in the auxiliary charge transferring unit and second transfer subsequent to the first transfer,
the retained charge distributing unit performs the distribution as first distribution and second distribution after the first transfer and the second transfer, respectively, in the generated charge transferring unit, and
the signal generating unit generates the signal as a first image signal and a second image signal after the first distribution and the second distribution, respectively, in the retained charge distributing unit.

(7) The solid-state imaging device according to (6), further including:
a charge discharging unit for discharging the charge retained in the output charge retaining unit during a period between generation of the first image signal in the signal generating unit and the second transfer in the generated charge transferring unit, in which the signal generating unit further generates the signal as a reference signal during a period between the discharge in the charge discharging unit and the second transfer in the generated charge transferring unit, and the retained charge distributing unit further performs the distribution at the time of the discharge in the charge discharging unit and at the time of generating the reference signal in the signal generating unit.

(8) The solid-state imaging device according to (7), in which the retained charge distributing unit temporarily renders the generated charge retaining unit and the output charge retaining unit non-conductive therebetween during a period between the discharge in the charge discharging unit and the generation of the reference signal in the signal generating unit and then renders conductive therebetween.

(9) The solid-state imaging device according to (7) or (8), further including:

a signal processing unit for subtracting a value obtained by doubling the reference signal from a value obtained by adding the first image signal and the second image signal.

(10) The solid-state imaging device according to any one of (6) to (8), further including:

an auxiliary charge retaining gate unit for controlling potential of the auxiliary charge retaining unit, in which the auxiliary charge transferring unit includes an auxiliary charge transferring gate unit for controlling the conduction, and the auxiliary charge transferring gate unit is connected to the auxiliary charge retaining gate unit.

(11) A driving method of a solid-state imaging device, the method including:

a generated charge transferring step of transferring and retaining charge to and in a generated charge retaining unit for retaining the charge corresponding to an exposure amount in a predetermined exposure period, the generated charge retaining unit being formed to have a predetermined impurity concentration;

a retained charge distributing step of uniformly distributing the charge retained in the generated charge retaining unit to the output charge retaining unit, which is formed to have substantially the same impurity concentration as that of the generated charge retaining unit and retains the charge, and the generated charge retaining unit; and a signal generating step of generating a signal corresponding to the charge retained in the output charge retaining unit as an image signal.

REFERENCE SIGNS LIST

10 Imaging device
100 Pixel array unit
110 Pixel
111, 171 Photoelectric conversion unit
112, 172 Generated charge transferring unit
113, 173 Retained charge distributing unit
114 Charge discharging unit
115, 175 Generated charge retaining unit
116 Output charge retaining unit
117, 177 Overflow gate
118 Auxiliary charge transferring unit
119 Auxiliary charge retaining unit
120 Signal generating unit
121, 122 MOS transistor
133, 183 Generated charge retaining gate
137 Auxiliary charge retaining gate
200 Vertical driving unit
300 Horizontal transferring unit
310 Constant current source
320 Signal processing unit
321, 322, 324 Sample-and-hold circuit
323, 325 Subtractor
326 Adder
330 Switch
400 Analog-digital converter
500 Output buffer

The invention claimed is:

1. A solid-state imaging device, comprising:

a photoelectric conversion unit for generating charge corresponding to an exposure amount in a predetermined exposure period;

a generated charge retaining unit for retaining the charge, the generated charge retaining unit being formed in a semiconductor substrate to have a predetermined impurity concentration;

a generated charge transferring unit for rendering the photoelectric conversion unit and the generated charge retaining unit conductive therebetween after the predetermined exposure period has elapsed and transferring the charge from the photoelectric conversion unit to the generated charge retaining unit;

an output charge retaining unit for retaining the charge, the output charge retaining unit being formed to have substantially the same impurity concentration as that of the generated charge retaining unit;

a retained charge distributing unit for rendering the generated charge retaining unit and the output charge retaining unit conductive therebetween to uniformly distribute the charge retained in the generated charge retaining unit to the generated charge retaining unit and the output charge retaining unit; and a signal generating unit for generating a signal corresponding to the charge retained in the output charge retaining unit as an image signal after the distribution in the retained charge distributing unit.

2. The solid-state imaging device according to claim 1, further comprising:

a charge discharging unit for discharging the charge retained in the output charge retaining unit after generation of the image signal in the signal generating unit, wherein the signal generating unit further generates the signal as a reference signal after the discharge in the charge discharging unit, and the retained charge distributing unit further performs the distribution at the time of the discharge in the charge discharging unit and at the time of generating the reference signal in the signal generating unit.

3. The solid-state imaging device according to claim 2, wherein the retained charge distributing unit temporarily renders the generated charge retaining unit and the output charge retaining unit non-conductive therebetween during a period between the discharge in the charge discharging unit and the generation of the reference signal in the signal generating unit and then renders conductive therebetween.

4. The solid-state imaging device according to claim 2, further comprising:

a signal processing unit for subtracting the reference signal from the image signal.

5. The solid-state imaging device according to claim 1, further comprising:

a generated charge retaining gate unit for controlling potential of the generated charge retaining unit, wherein the generated charge transferring unit comprises a generated charge transferring gate unit for controlling the conduction, and the generated charge transferring gate unit is connected to the generated charge retaining gate unit.

6. The solid-state imaging device according to claim 1, further comprising:

an auxiliary charge retaining unit for retaining the charge, the auxiliary charge retaining unit being formed to have an impurity concentration lower than that of the generated charge retaining unit; and an auxiliary charge transferring unit for rendering the photoelectric conversion unit and the auxiliary charge retaining unit conductive therebetween after the exposure period has elapsed and transferring the charge from the photoelectric conversion unit to the auxiliary charge retaining unit, wherein the generated charge transferring unit performs transfer of the charge retained in the auxiliary charge retaining unit to the generated charge retaining unit executed by rendering the auxiliary charge retaining unit and the generated charge retaining unit conductive therebetween as first transfer synchronized with the transfer in the auxiliary charge transferring unit and second transfer subsequent to the first transfer, the retained charge distributing unit performs the distribution as first distribution and second distribution after the first transfer and the second transfer, respectively, in the generated charge transferring unit, and the signal generating unit generates the signal as a first image signal and a second image signal after the first distribution and the second distribution, respectively, in the retained charge distributing unit.

7. The solid-state imaging device according to claim 6, further comprising:

a charge discharging unit for discharging the charge retained in the output charge retaining unit during a period between generation of the first image signal in the signal generating unit and the second transfer in the generated charge transferring unit, wherein the signal generating unit further generates the signal as a reference signal during a period between the discharge in the charge discharging unit and the second transfer in the generated charge transferring unit, and the retained charge distributing unit further performs the distribution at the time of the discharge in the charge discharging unit and at the time of generating the reference signal in the signal generating unit.

8. The solid-state imaging device according to claim 7, wherein the retained charge distributing unit temporarily renders the generated charge retaining unit and the output charge retaining unit non-conductive therebetween during a period between the discharge in the charge discharging unit and the generation of the reference signal in the signal generating unit and then renders conductive therebetween.

9. The solid-state imaging device according to claim 7, further comprising:

a signal processing unit for subtracting a value obtained by doubling the reference signal from a value obtained by adding the first image signal and the second image signal.

10. The solid-state imaging device according to claim 6, further comprising:

an auxiliary charge retaining gate unit for controlling potential of the auxiliary charge retaining unit, wherein the auxiliary charge transferring unit comprises an auxiliary charge transferring gate unit for controlling the conduction, and the auxiliary charge transferring gate unit is connected to the auxiliary charge retaining gate unit.

11. A driving method of a solid-state imaging device, the method comprising:

a generated charge transferring step of transferring and retaining charge to and in a generated charge retaining unit for retaining the charge corresponding to an exposure amount in a predetermined exposure period, the generated charge retaining unit being formed to have a predetermined impurity concentration;

a retained charge distributing step of uniformly distributing the charge retained in the generated charge retaining unit to an output charge retaining unit, which is formed to have substantially the same impurity concentration as that of the generated charge retaining unit and retains the charge, and the generated charge retaining unit; and a signal generating step of generating a signal corresponding to the charge retained in the output charge retaining unit as an image signal.

* * * * *